(12) United States Patent
Yamada et al.

(10) Patent No.: US 7,821,283 B2
(45) Date of Patent: Oct. 26, 2010

(54) CIRCUIT BOARD APPARATUS FOR WAFER INSPECTION, PROBE CARD, AND WAFER INSPECTION APPARATUS

(75) Inventors: Daisuke Yamada, Hidaka (JP); Kiyoshi Kimura, Hidaka (JP); Fujio Hara, Hidaka (JP)

(73) Assignee: JSR Corporation, Tokyo (JP)

( * ) Notice: Subject to any disclaimer, the term of this patent is extended or adjusted under 35 U.S.C. 154(b) by 89 days.

(21) Appl. No.: 12/158,499

(22) PCT Filed: Dec. 20, 2006

(86) PCT No.: PCT/JP2006/325368

§ 371 (c)(1),
(2), (4) Date: Jun. 20, 2008

(87) PCT Pub. No.: WO2007/072852

PCT Pub. Date: Jun. 28, 2007

(65) Prior Publication Data

US 2009/0039906 A1 Feb. 12, 2009

(30) Foreign Application Priority Data

Dec. 22, 2005 (JP) ............................. 2005-369683
Feb. 2, 2006 (JP) ............................. 2006-025698
Sep. 27, 2006 (JP) ............................. 2006-262824

(51) Int. Cl.
*G01R 31/26* (2006.01)
(52) U.S. Cl. ............... 324/765; 324/754; 324/158.1; 439/482; 439/91; 439/66
(58) Field of Classification Search ......... 324/754–765, 324/158.1; 439/482, 91, 66
See application file for complete search history.

(56) References Cited

U.S. PATENT DOCUMENTS 5,574,382 A * 11/1996 Kimura ...................... 324/754

(Continued)

FOREIGN PATENT DOCUMENTS

JP     2004 309467     11/2004

(Continued)

*Primary Examiner*—Ha Tran T Nguyen
*Assistant Examiner*—Richard Isla Rodas
(74) *Attorney, Agent, or Firm*—Oblon, Spivak, McClelland, Maier & Neustadt, L.L.P.

(57) ABSTRACT

Disclosed herein are a circuit board device for wafer inspection having high connection reliability, and a probe card and a wafer inspection apparatus, which are equipped with this circuit board device for wafer inspection. The circuit board device for wafer inspection has a board body and a connector device provided on the board body and obtained by stacking a plurality of connector units on each other, wherein each of the connector units has a first anisotropically conductive elastomer sheet, a composite conductive sheet, a second anisotropically conductive elastomer sheet and a pitch converting board, the composite conductive sheet has an insulating sheet, in which a plurality of through-holes have been formed, and rigid conductors respectively arranged into the through-holes in this insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet.

9 Claims, 14 Drawing Sheets

U.S. PATENT DOCUMENTS

| | | | |
|---|---|---|---|
| 5,613,862 A * | 3/1997 | Naylor | 439/91 |
| 5,624,268 A * | 4/1997 | Maeda et al. | 439/66 |
| 5,672,978 A * | 9/1997 | Kimura | 324/754 |
| 6,297,652 B1 * | 10/2001 | Shimoda et al. | 324/754 |
| 6,815,961 B2 * | 11/2004 | Mok et al. | 324/754 |
| 7,059,874 B2 * | 6/2006 | Weiss | 439/91 |
| 7,077,659 B2 * | 7/2006 | Weiss et al. | 439/66 |
| 7,520,761 B2 * | 4/2009 | Weiss | 439/91 |
| 7,705,618 B2 * | 4/2010 | Kimura et al. | 324/754 |
| 2004/0124829 A1 * | 7/2004 | Swettlen et al. | 324/158.1 |
| 2006/0035510 A1 * | 2/2006 | Numata et al. | 439/372 |

FOREIGN PATENT DOCUMENTS

JP        2005 338073        12/2005

* cited by examiner

CIRCUIT BOARD APPARATUS FOR WAFER INSPECTION, PROBE CARD, AND WAFER INSPECTION APPARATUS

TECHNICAL FIELD

The present invention relates to a circuit board device for wafer inspection, which is used for conducting electrical inspection of a plurality of integrated circuits formed on a wafer in a state of the wafer, and a probe card and a wafer inspection apparatus, which are equipped with this circuit board device for wafer inspection.

BACKGROUND ART

In the production process of semiconductor integrated circuit devices, after a great number of integrated circuits are formed on a wafer composed of, for example, silicon, a probe test that basic electrical properties of each of these integrated circuits are inspected, thereby sorting out defective integrated circuits is generally conducted. This wafer is then diced, thereby forming semiconductor chips. Such semiconductor chips are housed and sealed in respective proper packages. Each of the packaged semiconductor integrated circuit devices is further subjected to a burn-in test that electrical properties thereof are inspected under a high-temperature environment, thereby sorting out semiconductor integrated circuit devices having latent defects.

In the probe test conducted for integrated circuits formed on a wafer, a method that a wafer is divided into a plurality of areas, in each of which, a plurality of, for example, 16 integrated circuits have been formed, a probe test is performed collectively on all the integrated circuits formed in an area, and the probe test is successively performed collectively on the integrated circuits formed in other areas has heretofore been adopted. In recent years, there has been a demand for collectively performing the probe test on a greater number of integrated circuits for the purpose of improving inspection efficiency and reducing inspection cost.

In the burn-in test on the other hand, it takes a long time to individually conduct electrical inspection of a great number of integrated circuit devices because each integrated circuit device that is an object of inspection is fine, and its handling is inconvenient, whereby inspection cost becomes considerably high. From such reasons, in recent years, there has been proposed a WLBI (Wafer Level Burn-in) test in which the burn-in test is performed collectively on a great number of integrated circuits formed on a wafer.

In such electrical inspection of integrated circuits, such as probe test or burn-in test, a probe card having a great number of contacts arranged in accordance with a pattern corresponding to a pattern of electrodes to be inspected in a wafer, which is an object of inspection, is in use for electrically connecting each of the electrodes to be inspected to a tester.

As the probe card, those, the contact member of which is of a cantilever type or vertical needle type, have heretofore been widely known. Flat type probe cards, the contact member of which is equipped with an anisotropically conductive connector having an anisotropically conductive film, and a sheet-like probe obtained by arranging electrode structures in an insulating sheet, have been recently proposed (see Patent Art. 1). These probe cards are so constructed that such a contact member as described above is arranged on a circuit board for inspection composed of, for example, a multi-layer printed wiring board.

When electrical inspection is performed collectively on a great number of integrated circuits formed on a wafer, a circuit board for inspection composed of a multi-layer printed wiring board, the number of layers is considerably great, for example, 30 to 40 layers or more, is used as a circuit board for inspection making up a probe card used in such inspection.

However, it is difficult to surely produce a multi-layer printed wiring board, the number of layers is considerably great, and which has high connection reliability. Thus, the yield of the circuit board for inspection becomes considerably low, so that a problem that the production cost of the probe card is increased, and in turn the inspection cost is increased arises.

Patent Art. 1: Japanese Patent Application Laid-Open No. 2004-53409.

DISCLOSURE OF THE INVENTION

Problems Sought for Solution by the Invention

The present invention has been made on the basis of the foregoing circumstances and has as its object the provision of a circuit board device for wafer inspection, which is used for conducting electrical inspection collectively on a great number of integrated circuits, can be produced at low cost and has high connection reliability, and a probe card and a wafer inspection apparatus, which are equipped with this circuit board device for wafer inspection.

Means for the Solution of the Problems

A circuit board device for wafer inspection according to the present invention is a circuit board device for wafer inspection used for conducting electrical inspection of a plurality of integrated circuits formed on a wafer in a state of the wafer and comprising a board body composed of a wiring board having connecting electrodes on a front surface thereof, and a connector device provided on the front surface of the board body and obtained by stacking a plurality of connector units on each other, wherein each of the connector units in the connector device has a first anisotropically conductive elastomer sheet, a composite conductive sheet arranged on the first anisotropically conductive elastomer sheet, a second anisotropically conductive elastomer sheet arranged on the composite conductive sheet and a pitch converting board arranged on the second anisotropically conductive elastomer sheet and composed of a wiring board having connecting electrodes on a front surface thereof and terminal electrodes on a back surface thereof, wherein the composite conductive sheet has an insulating sheet, in which a plurality of through-holes each extending in a thickness-wise direction of the insulating sheet has been formed, and rigid conductors respectively arranged into the through-holes in the insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, and wherein each of the connecting electrodes in the board body and the connecting electrodes in the pitch converting board is electrically connected to its corresponding terminal electrode in a pitch converting board arranged just above through the first anisotropically conductive elastomer sheet, the rigid conductor in the composite conductive sheet and the second anisotropically conductive elastomer sheet (this invention is referred to as "first invention").

A circuit board device for wafer inspection according to the present invention is a circuit board device for wafer inspection used for conducting electrical inspection of a plurality of integrated circuits formed on a wafer in a state of the wafer and comprising a board body composed of a wiring board having connecting electrodes on a front surface thereof, and a connector device provided on the front surface of the board body and obtained by stacking a plurality of connector units on each other, wherein each of the connector units in the connector device has a first anisotropically conductive elastomer sheet, a composite conductive sheet arranged on the first anisotropically conductive elastomer sheet, a plate-like spacer member provided on the composite conductive sheet, a second anisotropically conductive elastomer sheet arranged on the spacer member and a pitch converting board arranged on the second anisotropically conductive elastomer sheet and composed of a wiring board having connecting electrodes on a front surface thereof and terminal electrodes on a back surface thereof, wherein the composite conductive sheet has an insulating sheet, in which a plurality of through-holes each extending in a thickness-wise direction of the insulating sheet has been formed, and rigid conductors respectively arranged into the through-holes in the insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, wherein in the spacer member, a plurality of openings having a diameter greater than the diameter of the terminal portion in the rigid conductor is formed at positions corresponding to the respective rigid conductors in the composite conductive sheet, and wherein each of the connecting electrodes in the board body and the connecting electrodes in the pitch converting board is electrically connected to its corresponding terminal electrode in a pitch converting board arranged just above through the first anisotropically conductive elastomer sheet, the rigid conductor in the composite conductive sheet and the second anisotropically conductive elastomer sheet (this invention is referred to as "second invention").

In such a circuit board device for wafer inspection, a movable distance of each rigid conductor in the thickness-wise direction of the insulating sheet in the composite conductive sheet may preferably be 5 to 50 μm.

Each of the first anisotropically conductive elastomer sheet and second anisotropically conductive elastomer sheet may preferably be such that conductive particles exhibiting magnetism are contained in an elastic polymeric substance in a state oriented so as to align in a thickness-wise direction of the sheet to form chains, and in a state that the chains by the conductive particles have been distributed in a plane direction.

A circuit board device for wafer inspection according to the present invention is a circuit board device for wafer inspection used for conducting electrical inspection of a plurality of integrated circuits formed on a wafer in a state of the wafer and comprising a board body composed of a wiring board having connecting electrodes on a front surface thereof, and a connector device provided on the front surface of the board body and obtained by stacking a plurality of connector units on each other, wherein each of the connector units in the connector device has an anisotropically conductive elastomer sheet and a pitch converting board arranged on the anisotropically conductive elastomer sheet and composed of a wiring board having connecting electrodes on a front surface thereof and terminal electrodes on a back surface thereof, and wherein each of the connecting electrodes in the board body and the connecting electrodes in the pitch converting board is electrically connected to its corresponding terminal electrode in a pitch converting board arranged just above through the anisotropically conductive elastomer sheet (this invention is referred to as "third invention").

In such a circuit board device for wafer inspection, the anisotropically conductive elastomer sheet may preferably be such that conductive particles exhibiting magnetism are contained in an elastic polymeric substance in a state oriented so as to align in a thickness-wise direction of the sheet to form chains, and in a state that the chains by the conductive particles have been distributed in a plane direction.

In the circuit board devices for wafer inspection according to the present invention, the connector device may favorably be obtained by stacking three or more connector units on one another.

A probe card according to the present invention comprises any one of the above-described circuit board devices for wafer inspection and a contact member provided on the circuit board device for wafer inspection.

A wafer inspection apparatus according to the present invention comprises the above-described probe card.

A composite conductive sheet according to the present invention comprises an insulating sheet, in which a plurality of through-holes each extending in a thickness-wise direction of the insulating sheet has been formed, rigid conductors respectively arranged into the through-holes in the insulating sheet so as to protrude from both surfaces of the insulating sheet, in each of which terminal portions having a diameter greater than the diameter of the through-hole are formed on both ends of a body portion inserted into the through-hole in the insulating sheet, and a plate-like spacer member integrally provided on the insulating sheet and having a plurality of openings having a diameter greater than the diameter of the terminal portion in the rigid conductor and formed at positions corresponding to the respective rigid conductors, wherein each of the rigid conductors is provided movably in the thickness-wise direction of the insulating sheet.

EFFECTS OF THE INVENTION

According to the circuit board device for wafer inspection recited in the first invention or second invention, the connector device obtained by stacking a plurality of connector units having the pitch converting board on each other is provided, so that the pitch converting board in each connector unit can be constructed by a single-layer wiring board or a multi-layer wiring board in which the number of layers is small, and such a wiring board can be produced with relative ease at a high yield, whereby the production cost of the whole circuit board device for wafer inspection can be reduced.

The first anisotropically conductive elastomer sheet, composite conductive sheet having the rigid conductors and second anisotropically conductive elastomer sheet are stacked on one another between pitch converting boards adjacent to each other and between the board body and the pitch converting board, and the rigid conductors of the composite conductive sheet are provided movably in the thickness-wise direction of the insulating sheet, so that the first anisotropically conductive elastomer sheet and second anisotropically conductive elastomer sheet are compressed and deformed interlocking with each other by movement of the rigid conductors. As a result, the irregularity-absorbing ability that both sheets have is surely developed, so that high connection reliability is achieved between the pitch converting boards adjacent to each other and between the board body and the pitch converting board.

Accordingly, a circuit board device for wafer inspection, which can be produced at low cost and has high connection reliability, can be obtained.

According to the circuit board device for wafer inspection recited in the second invention, the spacer member is provided between the composite conductive sheet and the second anisotropically conductive elastomer sheet in the connector unit, so that the pressure applied to the first anisotropically conductive elastomer sheet and second anisotropically conductive elastomer sheet by the rigid conductors is relieved. As a result, the first anisotropically conductive elastomer sheet and second anisotropically conductive elastomer sheet can be prevented or inhibited from causing premature trouble.

According to the circuit board device for wafer inspection recited in the third invention, the connector device obtained by stacking a plurality of connector units having the pitch converting board on each other is provided, so that the pitch converting board in each connector unit can be constructed by a single-layer wiring board or a multi-layer wiring board small in the number of layers, and such a wiring board can be produced with relative ease at a high yield, whereby the production cost of the whole circuit board device for wafer inspection can be reduced.

According to the probe card of the present invention, any one of the above-described circuit board devices for wafer inspection is provided, so that said probe card can be produced at low cost, and high connection reliability can be achieved.

According to the wafer inspection apparatus of the present invention, the above-described probe card is provided, so that inspection cost can be reduced, and inspection can be performed on a wafer with high reliability.

DESCRIPTION OF CHARACTERS

Figure 1:
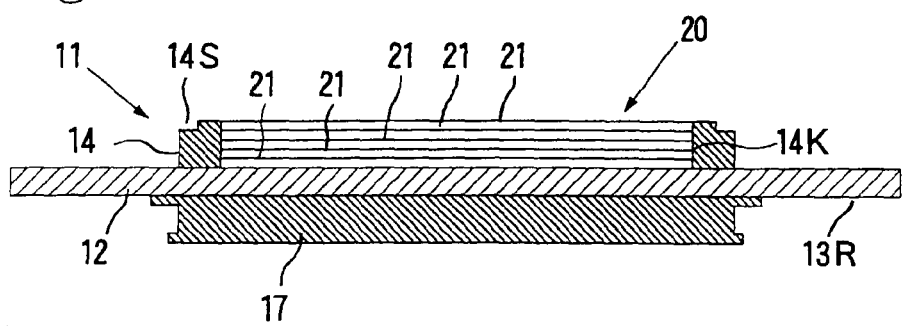
[FIG. 1] is a cross-sectional view illustrating the construction of an exemplary circuit board device for wafer inspection according to the first invention.

2 Controller
3 Input-output terminals
3R Input-output terminal portion
4 Connector
4A Conductive pins
4B Supporting member
5 Wafer mounting table
6 Wafer
7 Electrodes to be inspected
10 Probe card
11 Circuit board device for wafer inspection
12 Board body
13 Lead electrodes
13R Lead electrode part
14 Holder
14K Opening
14S Step portion
15 Connecting electrodes
17 Reinforcing member
20 Connector device
21 Connector units
22 First anisotropically conductive elastomer sheet
22A Layer of material for conductive elastomer
22B Material for conductive elastomer
23 Second anisotropically conductive elastomer sheet
23a Anisotropically conductive elastomer sheet
24 Spacer member
24H Openings
25 Composite conductive sheet
25A Composite laminate material
25B Laminate material
26 Insulating sheet
26H Through-holes
27 Rigid conductors
27a Body portions
27b Terminal portions
28A Metal layer
28B Thin metal layer
28K Openings
29 Resist layer
29H Pattern holes
30 Pitch converting boards
31 Connecting electrodes
32 Terminal electrodes
35 One surface-side molding member
36 Other surface-side molding member
37 Spacer
37K Opening
38 Press roll device
38a Press roll
38b Supporting roll
39 Contact member
40 Anisotropically conductive connector
41 Frame plate
42 Openings
43 Elastic anisotropically conductive films
44 Conductive parts for connection
45 Insulating parts
46 Functional parts
47 Projected portions
48 Parts to be supported
50 Sheet-like probe
51 Frame plate
52 Openings
54 Holding member
55 Contact films
55A Laminate
56 Insulating films
56A Resin sheet for insulating films
57 Electrode structures
57H Through-holes
57a Front-surface electrode parts
57b Back-surface electrode parts
57c Short circuit parts
57d Holding parts
58 Metal film
58A Metal foil for back-surface electrode parts
59 Adhesive layer
60 Protecting tape

BEST MODE FOR CARRYING OUT THE INVENTION

The embodiments of the present invention will hereinafter be described in detail.

<Circuit Board Device for Wafer Inspection>

Figure 2:
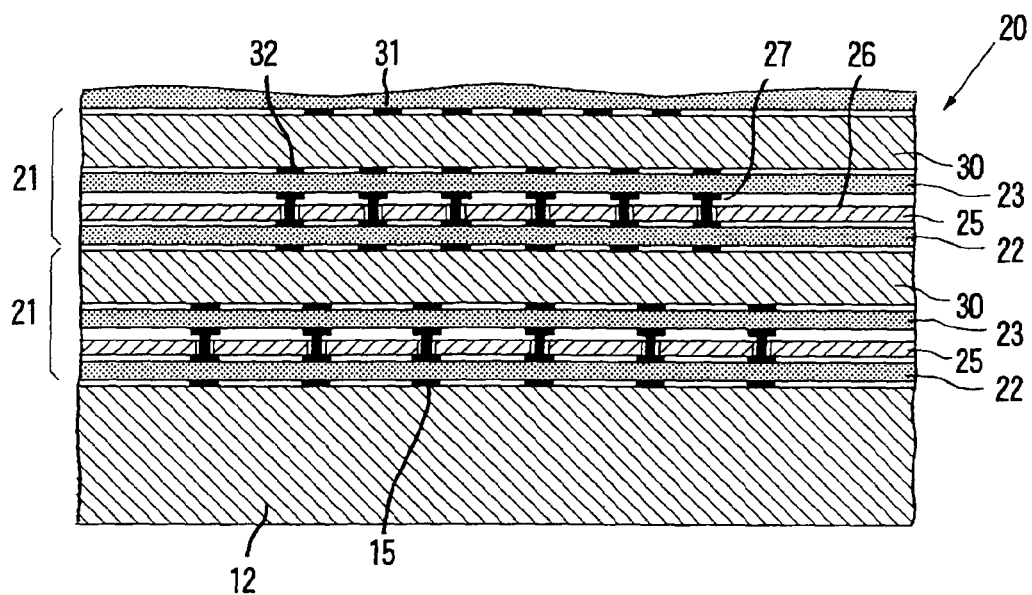
[FIG. 2] is a cross-sectional view illustrating the construction of a principal part of the circuit board device for wafer inspection shown in FIG. 1.

FIG. 1 is a cross-sectional view illustrating the construction of an exemplary circuit board device for wafer inspection according to the first invention, and FIG. 2 is a cross-sectional view illustrating the construction of a principal part of the circuit board device for wafer inspection shown in FIG. 1.

Figure 3:
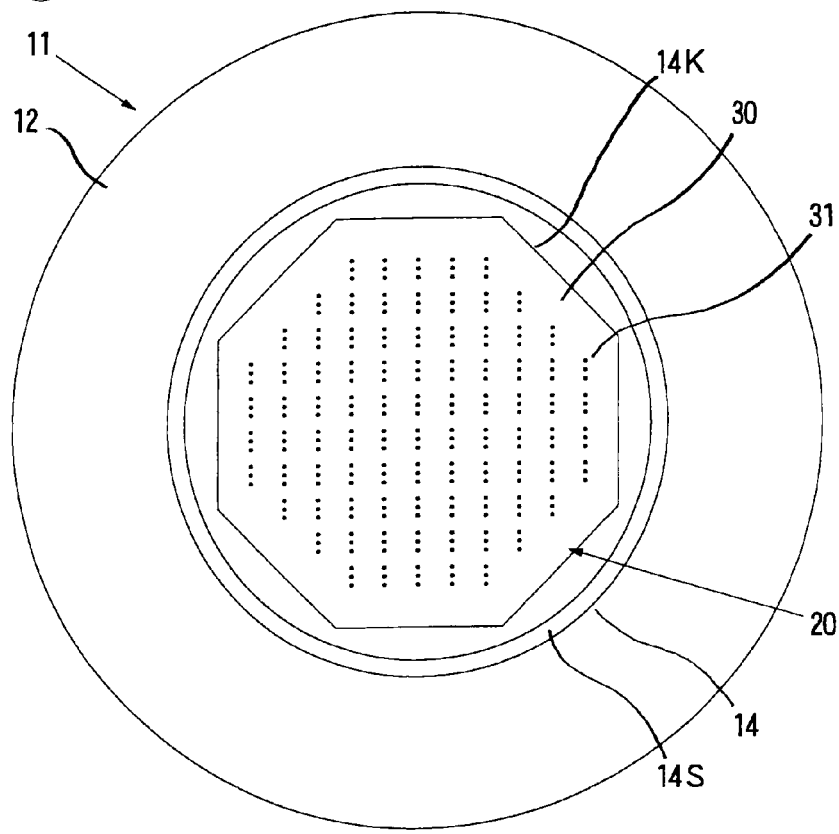
[FIG. 3] is a plan view of the circuit board device for wafer inspection shown in FIG. 1.

This circuit board device 11 for wafer inspection is used for collectively conducting electrical inspection on each of all integrated circuits formed on, for example, a wafer in a state of the wafer, and has a board body 12 composed of a disk-like wiring board as also illustrated in FIG. 3. A connector device 20 in a regular-octagonal planar shape is arranged at a central portion on a front surface (upper surface in FIG. 1 and FIG. 2) of this board body 12. This connector device 20 is held by a holder 14 fixed to the front surface of the board body 12. A reinforcing member 17 is provided at a central portion on a back surface of the board body 12.

The holder 14 has an opening 14K in a shape (regular-octagonal form in the illustrated embodiment) fitted to the external shape of the connector device 20, and the connector device 20 is housed in this opening 14K. A peripheral edge of the holder 14 is circular, and a step portion 14S is formed at the peripheral edge of the holder 14 along a circumferential direction thereof.

Figure 4:
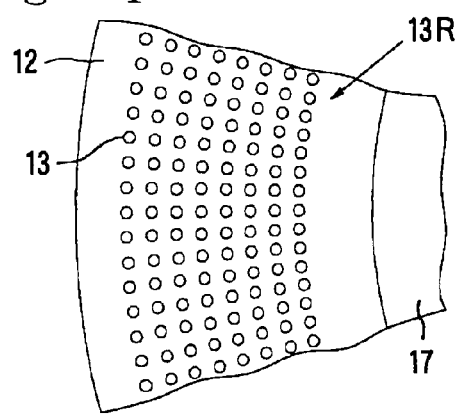
[FIG. 4] illustrates, on an enlarged scale, a lead electrode part in the circuit board device for wafer inspection shown in FIG. 1.

A plurality of connecting electrodes 15 corresponding to electrodes to be inspected of all integrated circuits formed on a wafer, which is an object of inspection, is formed in accordance with a proper pattern at a central portion on the front surface of the board body 12. On the other hand, as illustrated in FIG. 4, a lead electrode part 13R, in which a plurality of lead electrodes 13 are arranged so as to align along a circumferential direction of the board body 12, is formed at a peripheral edge portion on the back surface of the board body 12. A pattern of the lead electrodes 13 is a pattern corresponding to a pattern of input-output terminals of a controller in a wafer inspection apparatus, which will be described subsequently. Each of the lead electrodes 13 is electrically connected to its corresponding connecting electrode through an internal wiring (not illustrated).

As a base material for forming the board body 12, may be used any of conventionally known various materials, and specific examples thereof include composite resin base materials such as glass fiber-reinforced epoxy resins, glass fiber-reinforced phenol resins, glass fiber-reinforced polyimide resins and glass fiber-reinforced bismaleimide triazine resins.

The connector device 20 is constructed by stacking a plurality of connector units 21 on each other. Each of the connector units 21 is constructed by a first anisotropically conductive elastomer sheet 22, a composite conductive sheet 25 arranged on the first anisotropically conductive elastomer sheet 22, a second anisotropically conductive elastomer sheet 23 arranged on the composite conductive sheet 25 and a pitch converting board 30 arranged on the second anisotropically conductive elastomer sheet 23 and composed of, for example, a printed wiring board.

In such a connector device 20, three or more connector units 21 are preferably stacked, and five or more connector units 21 are more preferably stacked. If the number of connector units stacked is too small, it is necessary that the pitch converting board 30 is made up of a multi-layer wiring board great in the number of layers, so that the yield of such a pitch converting board 30 is lowered. As a result, the production cost of the whole circuit board device 11 for wafer inspection is increased. It is hence not preferable that the number of connector units is too small.

Figure 5:
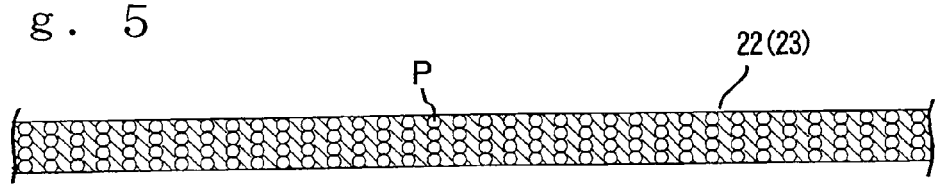
[FIG. 5] is a cross-sectional view illustrating, on an enlarged scale, a principal part of an anisotropically conductive elastomer sheet.

As illustrated in FIG. 5, each of the first anisotropically conductive elastomer sheet 22 and second anisotropically conductive elastomer sheet 23 in the connector unit 21 is such that conductive particles P exhibiting magnetism are contained in an insulating elastic polymeric substance in a state oriented so as to align in a thickness-wise direction of the sheet to form chains, and in a state that the chains of the conductive particles P have been distributed in a plane direction.

The elastic polymeric substance forming each of the first anisotropically conductive sheet 22 and second anisotropically conductive elastomer sheet 23 is preferably a polymeric substance having a crosslinked structure. Various materials may be used as curable polymeric substance-forming materials usable for obtaining such elastic polymeric substances. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene, urethane rubber, polyester rubber, epichlorohydrin rubber, silicone rubber, ethylene-propylene copolymer rubber, and ethylene-propylene-diene terpolymer rubber. Among these, silicone rubber is preferably used from the viewpoints of durability, molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those containing a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint that the resulting anisotropically conductive elastomer sheet has good heat resistance.

As the conductive particles P contained in the first anisotropically conductive elastomer sheet 22 and second anisotropically conductive elastomer sheet 23, conductive particles exhibiting magnetism are used in that such particles can be easily oriented so as to align in the thickness-wise direction by a process, which will be described subsequently. Specific examples of such conductive particles include particles of metals having magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on the means for coating the surfaces of the core particles with the conductive metal. However, for example, a chemical plating, electroplating, sputtering or vapor deposition process is used.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The number average particle diameter of the conductive particles P is preferably 3 to 20 μm, more preferably 5 to 15 μm. If this number average particle diameter is too small, it may be difficult in some cases to orient the conductive particles P in the thickness-wise direction in a production process, which will be described subsequently. If this number average particle diameter is too great on the other than, it may be difficult in some cases to obtain an anisotropically conductive elastomer sheet having high resolving power.

The particle diameter distribution (Dw/Dn) of the conductive particles P is preferably 1 to 10, more preferably 1.01 to 7, still more preferably 1.05 to 5, particularly preferably 1.1 to 4.

No particular limitation is imposed on the form of the conductive particles P. However, they are preferably in the form of a sphere or star, or secondary particles obtained by aggregating these particles from the viewpoint of permitting easy dispersion of these particles in the polymeric substance-forming material.

Those obtained by treating surfaces of the particles with a coupling agent such as a silane coupling agent, or a lubricant may be suitably used as the conductive particles P. By treating the surfaces of the particles with the coupling agent or lubricant, the durability of the resulting anisotropically conductive elastomer sheet is improved.

Such conductive particles P are preferably contained in a proportion of 10 to 40%, particularly 15 to 35% in terms of volume fraction in the anisotropically conductive elastomer sheet. If this proportion is too low, an anisotropically conductive elastomer sheet having sufficiently high conductivity in a thickness-wise direction may not be obtained in some cases. If this proportion is too high on the other hand, the resulting anisotropically conductive elastomer sheet is liable to become brittle, so that elasticity required of the anisotropically conductive elastomer sheet may not be achieved in some cases.

The thickness of each of the first anisotropically conductive elastomer sheet 22 and second anisotropically conductive elastomer sheet 23 is preferably 20 to 100 μm, more preferably 25 to 70 μm. If this thickness is too small, sufficient irregularity-absorbing ability may not be achieved in such an anisotropically conductive elastomer sheet in some cases. If this thickness is too great on the other hand, high resolving power may not be achieved in such an anisotropically conductive elastomer sheet in some cases.

The first anisotropically conductive elastomer sheet 22 can be produced in the following manner.

Figure 6:
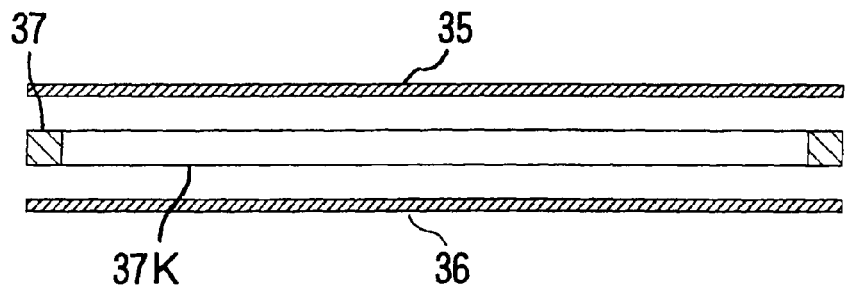
[FIG. 6] is a cross-sectional view illustrating a one surface-side molding member, an other surface-side molding member and a spacer for producing a first anisotropically conductive elastomer sheet.

As illustrated in FIG. 6, a one surface-side molding member 35 and an other surface-side molding member 36, which are each in the form of a sheet, and a frame-like spacer 37 having an opening 37K in a shape fitted to a planar shape of the intended first anisotropically conductive elastomer sheet 22 and a thickness corresponding to the thickness of the first anisotropically conductive elastomer sheet 22 are first provided, and at the same time, a material for conductive elastomer with conductive particles contained in a liquid polymeric substance-forming material, which will become an elastic polymeric substance by being cured, is prepared.

Figure 7:
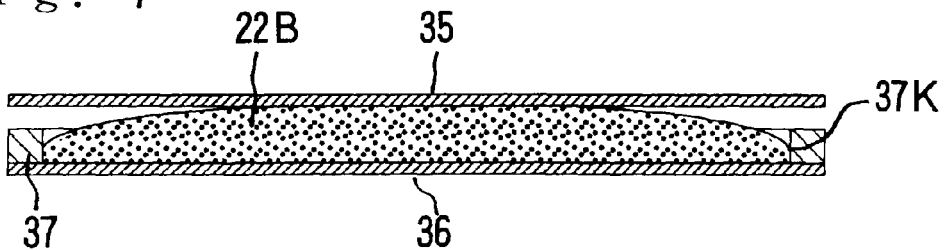
[FIG. 7] is a cross-sectional view illustrating a state that the surface of the other surface-side molding member has been coated with a material for conductive elastomer.

As illustrated in FIG. 7, the spacer 37 is arranged on a molding surface (upper surface in FIG. 7) of the other surface-side molding member 36, the prepared material 22B for conductive elastomer is applied to within the opening 37K of the spacer 37 on the molding surface of the other surface-side molding member 36, and the one surface-side molding member 35 is then arranged on this material 22B for conductive elastomer in such a manner that the molding surface (lower surface in FIG. 7) thereof comes into contact with the material 22B for conductive elastomer.

In the above-described process, resin sheets composed of a polyimide resin, polyester resin, acrylic resin or the like may be used as the one surface-side molding member 35 and other surface-side molding member 36.

The thickness of each of the resin sheets making up the one surface-side molding member 35 and other surface-side molding member 36 is preferably 50 to 500 μm, more preferably 75 to 300 μm. If this thickness is smaller than 50 μm, strength required of the molding member may not be achieved in some cases. If this thickness exceeds 500 μm on the other hand, it may be difficult in some cases to apply a magnetic field of necessary intensity to a layer of the material for conductive elastomer.

Figure 8:
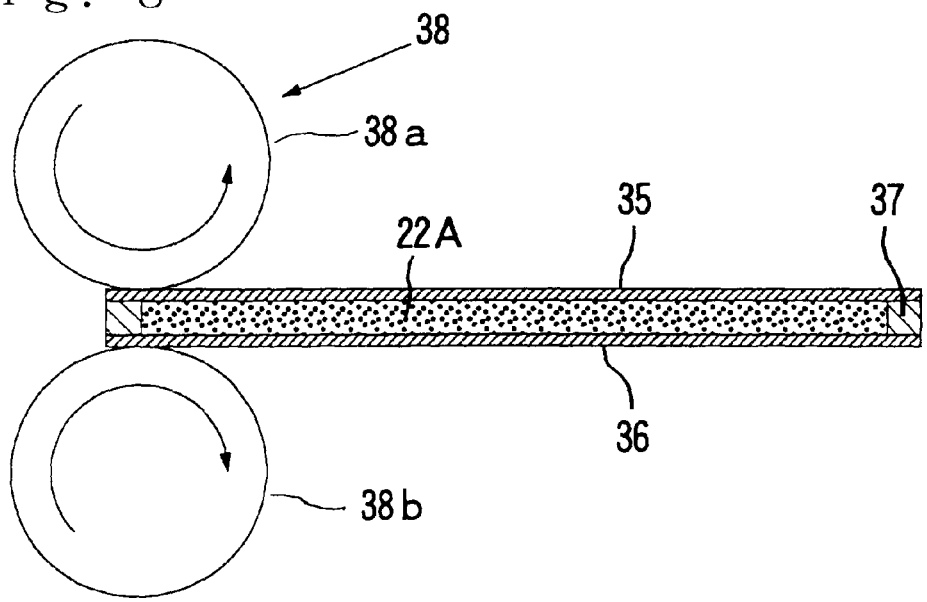
[FIG. 8] is a cross-sectional view illustrating a state that a layer of the material for conductive elastomer has been formed between the one surface-side molding member and the other surface-side molding member.
Figure 9:
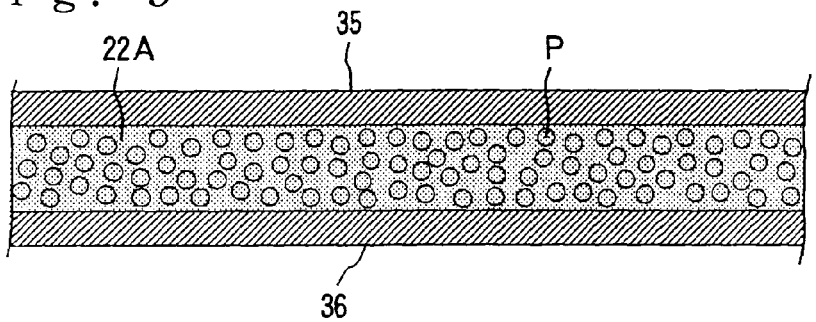
[FIG. 9] is a cross-sectional view illustrating, on an enlarged scale, the layer of the material for conductive elastomer shown in FIG. 8.

As illustrated in FIG. 8, a press roll device 38 composed of a press roll 38a and a supporting roll 38b is then used to pinch the material 22B for conductive elastomer by the one surface-side molding member 35 and other surface-side molding member 36, thereby forming a layer 22A of the material for conductive elastomer having a necessary thickness between the one surface-side molding member 35 and the other surface-side molding member 36. In this layer 22A of the material for conductive elastomer, as illustrated on an enlarged scale in FIG. 9, the conductive particles P are contained in an evenly dispersed state.

Figure 10:
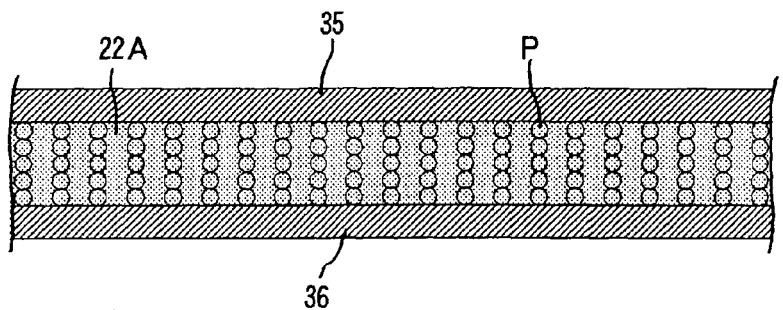
[FIG. 10] is a cross-sectional view illustrating a state that a magnetic field has been applied to the layer of the material for conductive elastomer shown in FIG. 8 in a thickness-wise direction of the layer.

For example, a pair of electromagnets are then arranged on a back surface of the one surface-side molding member 35 and a back surface of the other surface-side molding member 36, and the electromagnets are operated, thereby applying a parallel magnetic field to the layer 22A of the material for conductive elastomer in its thickness-wise direction. As a result, in the layer 22A of the material for conductive elastomer, the conductive particles P dispersed in the layer 22A of the material for conductive elastomer are oriented so as to align in the thickness-wise direction while retaining the state distributed in a plane direction as illustrated in FIG. 10, whereby a plurality of chains each composed of the conductive particles P and extending in the thickness-wise direction are formed in the state distributed in the plane direction.

In this state, the layer 22A of the material for conductive elastomer is then subjected to a curing treatment, thereby producing the first anisotropically conductive elastomer sheet 22 containing the conductive particles P in a state that the conductive particles P have been oriented so as to align in the thickness-wise direction in the elastic polymeric substance and in a state that the chains formed of the conductive particles P have been distributed in the plane direction.

In the above-described process, the curing treatment of the layer 22A of the material for conductive elastomer may be conducted in the state that the parallel magnetic field has been applied. However, the treatment may also be conducted after stopping the application of the parallel magnetic field.

The intensity of the parallel magnetic field applied to the layer 22A of the material for conductive elastomer is preferably an intensity that it amounts to 0.02 to 2.5 T on the average.

The curing treatment of the layer 22A of the material for conductive elastomer is suitably selected according to the material used. However, the treatment is generally conducted by a heat treatment. Specific heating temperature and heating time are suitably selected in view of the kinds of the polymeric substance-forming material forming the layer 22A of the material for conductive elastomer, and the like, the time required for movement of the conductive particles P, and the like.

The second anisotropically conductive elastomer sheet 23 may be produced in the same manner as in the first anisotropically conductive elastomer sheet 22.

Figure 11:
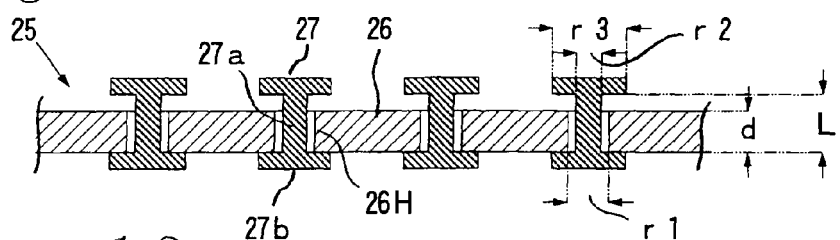
[FIG. 11] is a plan view illustrating, on an enlarged scale, a principal part of a composite conductive sheet.

As illustrated in FIG. 11, the composite conductive sheet 25 in the connector unit 21 is constructed by an insulating sheet 26, in which a plurality of through-holes 26H each extending in a thickness-wise direction of the sheet has been formed in accordance with a pattern corresponding to a pattern of terminal electrodes 32 of the pitch converting board 30, which will be described subsequently, and a plurality of rigid conductors 27 arranged respectively in the through-holes 26H in the insulating sheet 26 so as to protrude from both surfaces of the insulating sheet 26.

Each of the rigid conductors 27 is formed by a columnar body portion 27a inserted into the through-hole 26H in the insulating sheet 26 and terminal portions 27b integrally joined to and respectively formed on both ends of the columnar portion 27a and exposed to the surfaces of the insulating sheet 26. The length L of the body portion 27a in the rigid conductor 27 is greater than the thickness d of the insulating sheet 26, and the diameter r2 of the body portion 27a is smaller than the diameter r1 of the through-hole 26H in the insulating sheet 26, whereby the rigid conductor 27 is movable in a thickness-wise direction of the insulating sheet 26. The diameter r3 of each of the terminal portions 27b in the rigid conductor 27 is greater than the diameter r1 of the through-hole 26H in the insulating sheet 26.

As a material for forming the insulating sheet 26, may be used a resin material such as a liquid crystal polymer, polyimide resin, polyester resin, polyaramide resin or polyamide resin, a fiber-reinforced resin material such as a glass fiber-reinforced epoxy resin, glass fiber-reinforced polyester resin or glass fiber-reinforced polyimide resin, or a composite resin material with an inorganic material such as alumina or boron nitride contained as a filler in an epoxy resin or the like.

When the circuit board device 11 for wafer inspection is used under a high-temperature environment, an insulating sheet having a coefficient of linear thermal expansion of preferably at most $3\times10^{-5}$/K, more preferably $1\times10^{-6}$ to $2\times10^{-5}$/K, particularly preferably $1\times10^{-6}$ to $6\times10^{-6}$/K is used as the insulating sheet 26. Such an insulating sheet 26 is used, whereby positional deviation of the rigid conductors 27 due to the thermal expansion of the insulating sheet 26 can be inhibited.

The thickness d of the insulating sheet 26 is preferably 10 to 200 μm, more preferably 15 to 100 μm.

The diameter r1 of each of the through-holes 26H in the insulating sheet 26 is preferably 20 to 250 μm, more preferably 30 to 150 μm.

As a material for forming the rigid conductors 27, may be suitably used a metallic material having rigidity. In particular, a material harder to be etched than a thin metal layer formed on the insulating sheet 26 in a production process, which will be described subsequently, is preferably used. As specific examples of such a metallic material, may be mentioned simple metals such as nickel, cobalt, gold and aluminum, and alloys of these metals.

The diameter r2 of the body portion 27a in each of the rigid conductors 27 is preferably at least 18 μm, more preferably at least 25 μm. If this diameter r2 is too small, strength required of such rigid conductors 27 may not be achieved in some cases. A difference (r1−r2) between the diameter r1 of the through-hole 26H in the insulating sheet 26 and the diameter r2 of the body portion 27a in the rigid conductor 27 is preferably at least 1 μm, more preferably at least 2 μm. If this difference is too small, it may be difficult in some cases to provide the rigid conductors 27 movable in the thickness-wise direction of the insulating sheet 26.

The diameter r3 of each of the terminal portions 27b in the rigid conductor 27 is preferably 70 to 150% of a diameter of an electrode to be connected, i.e., the terminal electrode 32 in the pitch converting board 30. A difference (r3−r1) between the diameter r3 of each of the terminal portions 27b in the rigid conductor 27 and the diameter r1 of the through-hole 26H in the insulating sheet 26 is preferably at least 5 μm, more preferably at least 10 μm. If this difference is too small, the rigid conductors 27 may possibly fall off from the insulating sheet 26.

A movable distance of the rigid conductor 27 in the thickness-wise direction of the insulating sheet 26, i.e., a difference (L−d) between the length L of the body portion 27a in the rigid conductor 27 and the thickness d of the insulating sheet 26, is preferably 5 to 50 μm, more preferably 10 to 40 μm. If the movable distance of the rigid conductor 27 is too small, it may be difficult in some cases to achieve sufficient irregularity-absorbing ability in the whole connector unit. If the movable distance of the rigid conductor 27 is too great on the other hand, the length of the body portion 27a of the rigid conductor 27 exposed from the through-hole 26H in the insulating sheet 26 becomes great, so that the body portion 27a of the rigid conductor 27 may possibly be buckled or damaged when the connector device is used in inspection.

The composite conductive sheet 25 can be produced, for example, in the following manner.

Figure 12:
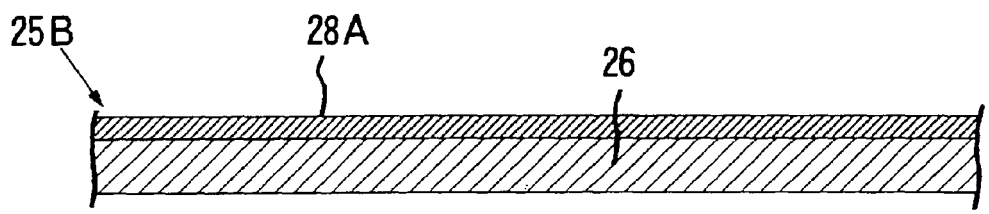
[FIG. 12] is a cross-sectional view illustrating the construction of a laminate material for producing the composite conductive sheet.
Figure 13:
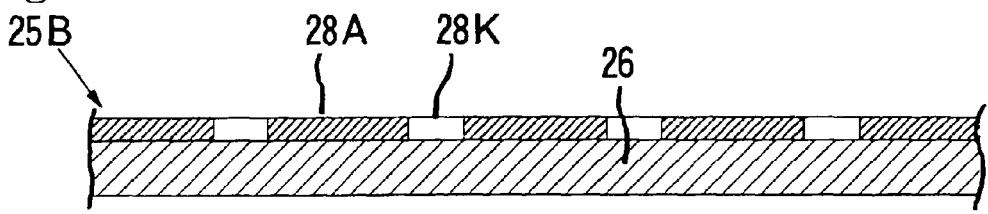
[FIG. 13] is a cross-sectional view illustrating a state that openings have been formed in a metal layer in the laminate material.
Figure 14:
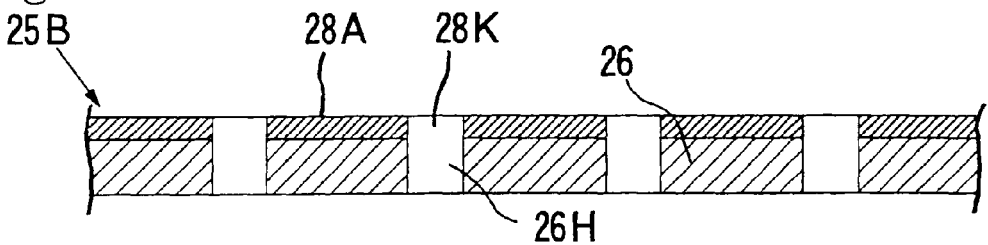
[FIG. 14] is a cross-sectional view illustrating a state that through-holes have been formed in an insulating sheet in the laminate material.
Figure 15:
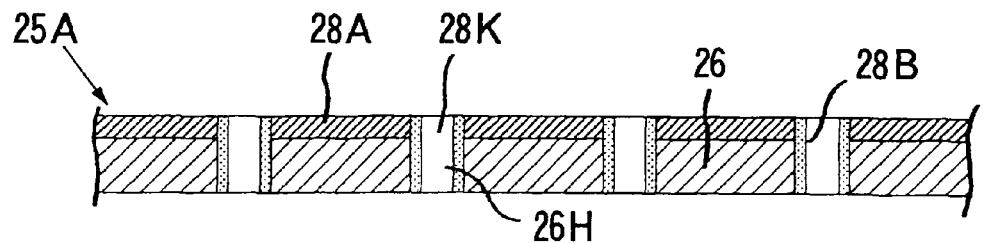
[FIG. 15] is a cross-sectional view illustrating the construction of a composite laminate material.

A laminate material 25B obtained by integrally laminating an easily etchable metal layer 28A on one surface of an insulating sheet 26 is first provided as illustrated in FIG. 12, and the metal layer 28A in the laminate material 25B is subjected to an etching treatment to remove a part thereof, thereby forming a plurality of openings 28K in the metal layer 28A in accordance with a pattern corresponding to a pattern of electrodes to be connected as illustrated in FIG. 13. Through-holes 26H respectively linked to the openings 28K of the metal layer 28A and each extending in a thickness-wise direction of the insulating sheet are then formed in the insulating sheet 26 in the laminate material 25B as illustrated in FIG. 14. Easily etchable cylindrical thin metal layers 28B are then formed so as to cover the inner wall surfaces of the through-holes 26H in the insulating sheet 26 and the opening edges of the metal layer 28A as illustrated in FIG. 15. In such a manner, a composite laminate material 25A having the insulating sheet 26, in which a plurality of the through-holes 26H each extending in the thickness-wise direction have been formed, the easily etchable metal layer 28A laminated on one surface of the insulating sheet 26 and having a plurality of the openings 28K respectively linked to the through-holes 26H in the insulating sheet 26, and the easily etchable thin metal layers 28B each formed so as to cover the inner wall surface of the through-hole 26H in the insulating sheet 26 and the opening edge of the metal layer 28A is produced.

In the above-described process, as a method for forming the through-holes 26H in the insulating sheet 26, may be used a laser beam machining method, drill machining method, etching method or the like.

As an easily etchable metallic material for forming the metal layer 28A and the thin metal layers 28B, may be used copper or the like.

The thickness of the metal layer 28A is preset in view of the intended movable distance of the rigid conductors 27, or the like. Specifically, the thickness is preferably 5 to 25 μm, more preferably 8 to 20 μm.

The thickness of the thin metal layers 28B is preset in view of the diameter of the through-hole 26H in the insulating sheet 26 and the diameter of the body portion 27a in the rigid conductors 27 to be formed.

As a method for forming the thin metal layers 28B, may be used an electroless plating method or the like.

Figure 16:
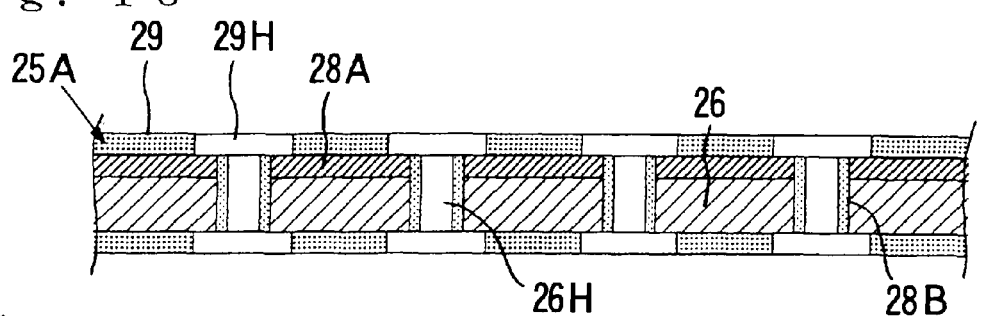
[FIG. 16] is a cross-sectional view illustrating a state that resist films have been formed on the composite laminate material.
Figure 17:
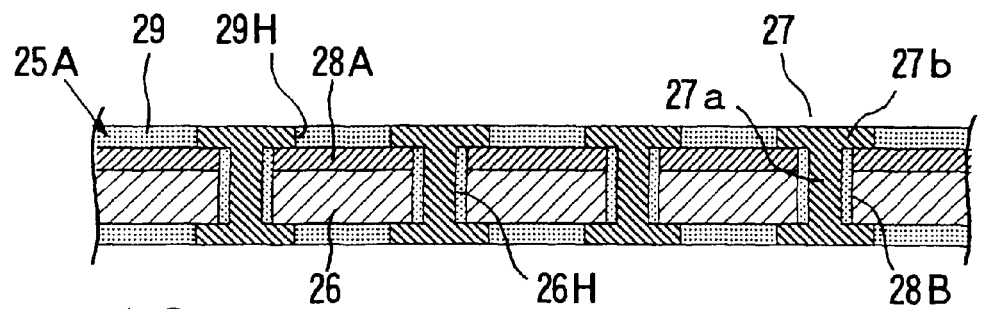
[FIG. 17] is a cross-sectional view illustrating a state that rigid conductors have been formed in the through-holes in the insulating sheet in the composite laminate material.

This composite laminate material 25A is subjected to a photo-plating treatment, thereby forming the rigid conductors 27 in the respective through-holes 26H in the insulating sheet 26. Specifically, a resist film 29, in which a plurality of pattern holes 29H respectively linked to the through-holes 26H in the insulating sheet 26 have been formed in accordance with a pattern corresponding to a pattern of the terminal portions 27b in the rigid conductors 27 to be formed, are respectively formed on the surface of the metal layer 28A formed on one surface of the insulating sheet 26 and the other surface of the insulating sheet 26 as illustrated in FIG. 16. An electroplating treatment is then conducted by using the metal layer 28A as a common electrode to deposit a metal on exposed portions in the metal layer 28A and at the same time to deposit a metal on the surfaces of the thin metal layers 28B so as to fill the metal into the through-holes 26H in the insulating sheet 26 and the pattern holes 29H in the resist films 29, thereby forming the rigid conductors 27 each extending in the thickness-wise direction of the insulating sheet 26 as illustrated in FIG. 17.

Figure 18:
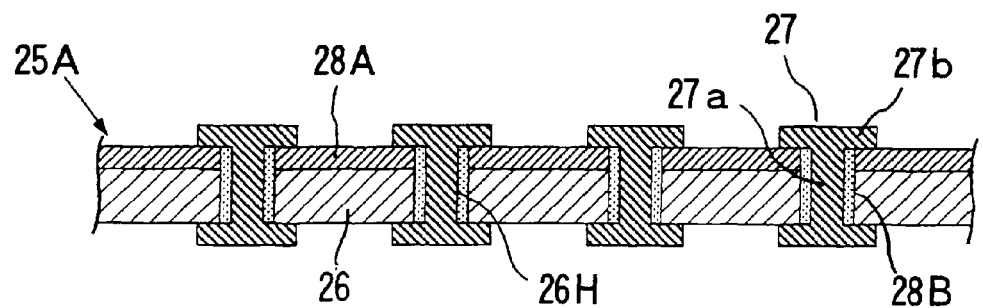
[FIG. 18] is a cross-sectional view illustrating a state that the resist films have been removed from the composite laminate material.

After the rigid conductors 27 are formed in such a manner, the resist film 29 is removed from the surface of the metal layer 28A, thereby exposing the metal layer 28A as illustrated in FIG. 18. An etching treatment is then conducted to remove the metal layer 28A and the thin metal layers 28B, thereby obtaining the composite conductive sheet 25 illustrated in FIG. 1.

A plurality of connecting electrodes 31 corresponding to electrodes to be inspected of all integrated circuits formed on a wafer, which is an object of inspection, are formed in accordance with a proper pattern on a front surface of the pitch converting board 30 in the connector unit 21. In the illustrated embodiment, the connecting electrodes are arranged in accordance with a pattern corresponding to a pattern of the electrodes to be inspected of the wafer, which is the object of inspection, on the pitch converting board 30 of the uppermost connector unit 21.

On the other hand, a plurality of terminal electrodes 32 are formed on a back surface of the pitch converting board 30. The respective terminal electrodes 32 are fundamentally arranged in accordance with a pattern corresponding to a pattern of connecting electrodes 31 of a pitch converting board 30 in a connector unit 21 arranged just under the connector unit 21 related to said pitch converting board 30, and in the pitch converting board 30 of the lowermost connector unit 21 (connector unit 21 arranged on the board body 12), the terminal electrodes are arranged in accordance with a pattern corresponding to a pattern of the connecting electrodes of the board body 12.

Each of the connecting electrodes 31 is electrically connected to its corresponding terminal electrode 32 through an internal wiring (not illustrated).

As a material of the wiring board forming the pitch converting board 30, may be used any of conventionally known various materials, and specific examples thereof include composite resin base materials such as glass fiber-reinforced epoxy resins, glass fiber-reinforced phenol resins, glass fiber-reinforced polyimide resins and glass fiber-reinforced bismaleimide triazine resins.

The pitch converting board 30 can be produced by using a conventionally known production process of a printed wiring board.

In the connector device 20, a plurality of the connector units 21 are stacked on each other and fixed by a proper fixing means (not illustrated) in a state pressurized in the thickness-wise direction, whereby the terminal electrodes 31 of the pitch converting board 30 in a connector unit 21 are electrically connected to their corresponding connecting electrodes 31 of the pitch converting board 30 in a connector unit 21 arranged just under said connector unit 21 or connecting electrodes 15 of the board body 12 through the second anisotropically conductive elastomer sheet 23, the rigid conductors 27 of the composite conductive sheet 25 and the first anisotropically conductive elastomer sheet 22.

According to such a circuit board device 11 for wafer inspection, the connector device 20 obtained by stacking a plurality of the connector units 21 having the pitch converting board 30 on each other is provided, so that the pitch converting board 30 in each connector unit 21 can be constructed by a single-layer wiring board or a multi-layer wiring board small in the number of layers, and such a wiring board can be produced with relative ease at a high yield, whereby the production cost of the whole circuit board device 11 for wafer inspection can be reduced.

The first anisotropically conductive elastomer sheet 22, the composite conductive sheet 25 having the rigid conductors 27 and the second anisotropically conductive elastomer sheet 23 are stacked on one another between pitch converting boards 30 adjacent to each other and between the board body 12 and the pitch converting board 30, and the rigid conductors 27 of the composite conductive sheet 25 are provided movably in the thickness-wise direction of the insulating sheet 26, so that the first anisotropically conductive elastomer sheet 22 and second anisotropically conductive elastomer sheet 23 are compressed and deformed interlocking with each other by movement of the rigid conductors 27. As a result, the irregularity-absorbing ability that both sheets have is surely developed, so that high connection reliability is achieved between the pitch converting boards 30 adjacent to each other and between the board body 12 and the pitch converting board 30.

Accordingly, a circuit board device 11 for wafer inspection, which can be produced at low cost and has high connection reliability, can be obtained.

Figure 19:
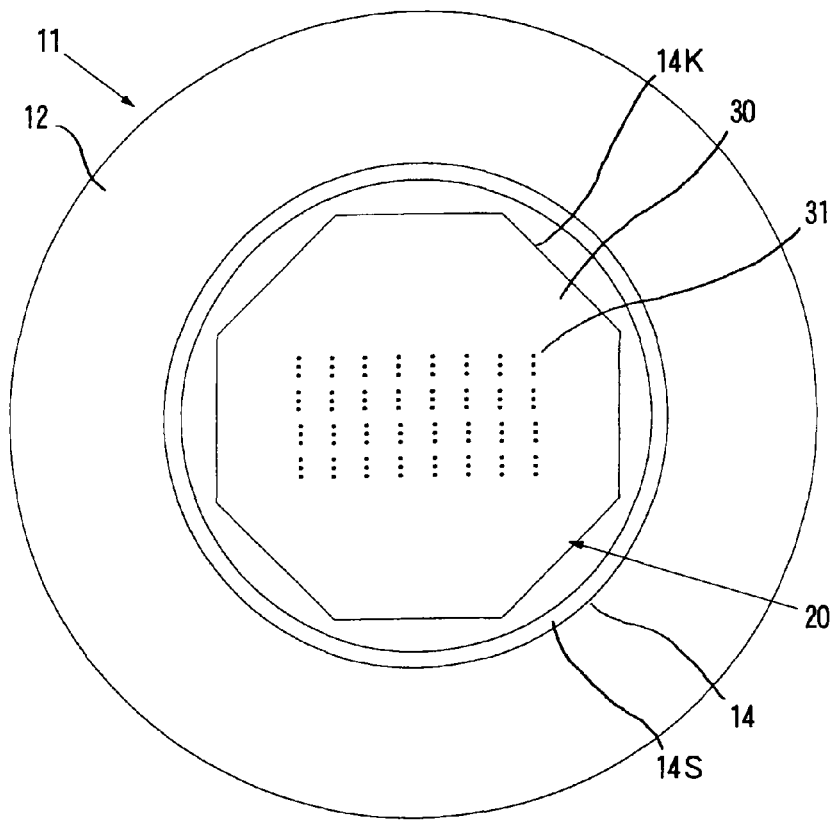
[FIG. 19] is a plan view of another exemplary circuit board device for wafer inspection according to the first invention.

FIG. 19 is a plan view of another exemplary circuit board device for wafer inspection according to the first invention.

This circuit board device 11 for wafer inspection is used for collectively conducting electrical inspection on each of some integrated circuits among integrated circuits formed on, for example, a wafer in a state of the wafer. This circuit board device 11 for wafer inspection basically has the same construction as the circuit board device 11 for wafer inspection shown in FIG. 1 except that the connecting electrodes 15 (see FIG. 2) of the board body 12, the rigid conductors 27 (see FIG. 2) of the composite conductive sheets 25, and the connecting electrodes 31 and terminal electrodes 32 (see FIG. 2) of the pitch converting boards 30 are provided corresponding to electrodes to be inspected of, for example, thirty-two (8×4) integrated circuits arranged in length and width among integrated circuits formed on a wafer, which is an object of inspection.

According to such a circuit board device 11 for wafer inspection, the same effects as in the circuit board device 11 for wafer inspection shown in FIG. 1 are achieved.

Figure 20:
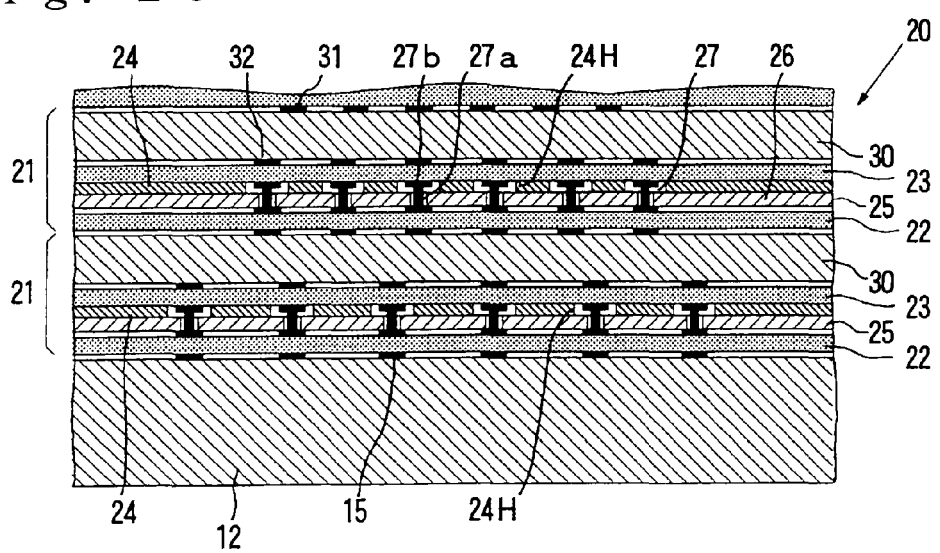
[FIG. 20] is a cross-sectional view illustrating the construction of a principal part of an exemplary circuit board device for wafer inspection according to the second invention.

FIG. 20 is a cross-sectional view illustrating the construction of a principal part of an exemplary circuit board device for wafer inspection according to the second invention. This circuit board device for wafer inspection basically has the same construction as the circuit board device for wafer inspection shown in FIG. 1 except for the connector device 20.

In this circuit board device for wafer inspection, each of connector units 21 making up a connector device 20 is constructed by a first anisotropically conductive elastomer sheet 22, a composite conductive sheet 25 arranged on the first anisotropically conductive elastomer sheet 22, a plate-like spacer member 24 integrally provided on the composite conductive sheet 25, a second anisotropically conductive elastomer sheet 23 arranged on the spacer member 24 and a pitch converting board 30 arranged on the second anisotropically conductive elastomer sheet 23 and composed of, for example, a printed wiring board. In this embodiment, the first anisotropically conductive elastomer sheet 22, composite conductive sheet 25, second anisotropically conductive elastomer sheet 23 and pitch converting board 30 respectively have the same constructions as those in the circuit board device for wafer inspection shown in FIG. 1.

In the spacer member 24, a plurality of openings 24H each having a diameter greater than the diameter of the terminal portion 27b of the rigid conductor 27 are formed at positions corresponding to the respective rigid conductors 27 in the composite conductive sheet 25, and the terminal portion 27b of the rigid conductor 27 is located in each of the openings 24.

The thickness of the spacer member 24 is suitably preset in view of the movable distance of each of the rigid conductors 27, the thickness of the terminal portion 27b, or the like, and is, for example, preferably 15 to 100 μm, more preferably 25 to 75 μm.

The diameter of each of the openings 24H in the spacer member 24 is preferably 1.1 to 8 times, more preferably 1.5 to 3 times as large as the diameter of the terminal portion 27b of the rigid conductor 27.

As a material forming the spacer member 24, a photoresist material or a proper resin material may be suitably used in that said spacer member 24 can be easily formed.

When the photoresist material is used as the material forming the spacer member 24, a spacer member 24 integrally formed on the insulating sheet 26 can be obtained by a photolithographic method.

When a proper resin material is used as the material forming the spacer member 24, a spacer member 24 integrally formed on the insulating sheet 26 can be obtained by forming openings in a film composed of the resin material and bonding this film to the insulating sheet 26.

According to such a circuit board device for wafer inspection, the same effects as in the circuit board device 11 for wafer inspection shown in FIG. 1 are achieved, and the pressure applied to the first anisotropically conductive elastomer sheet 22 and second anisotropically conductive elastomer sheet 23 by the rigid conductors 27 is relieved by providing the spacer member 24 between the composite conductive sheet 25 and the second anisotropically conductive elastomer sheet 24 in the connector unit 21, so that the first anisotropically conductive elastomer sheet 22 and second anisotropically conductive elastomer sheet 23 can be prevented or inhibited from causing premature trouble.

Figure 21:
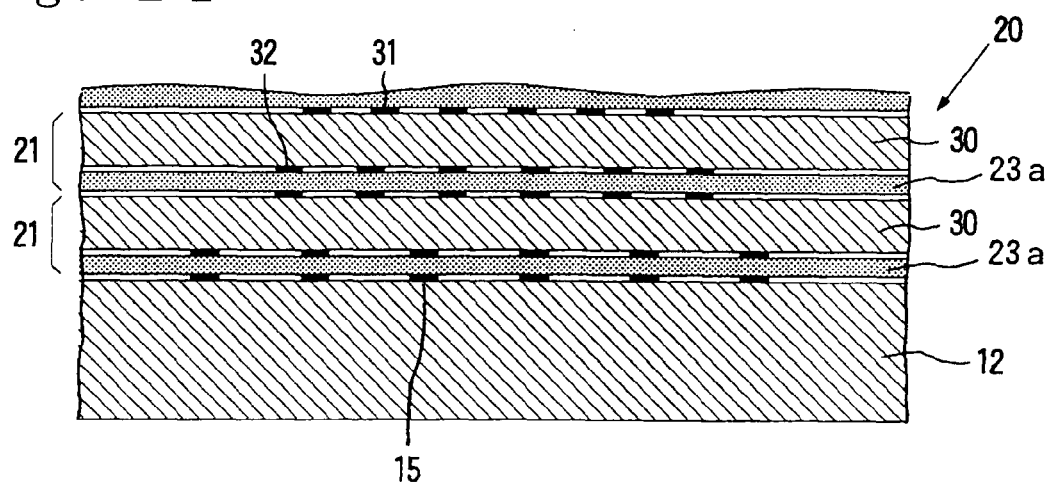
[FIG. 21] is a cross-sectional view illustrating the construction of a principal part of an exemplary circuit board device for wafer inspection according to the third invention.

FIG. 21 is a cross-sectional view illustrating the construction of a principal part of an exemplary circuit board device for wafer inspection according to the third invention. This circuit board device for wafer inspection has the same construction as the circuit board device for wafer inspection shown in FIG. 1 except for the connector device 20.

In this circuit board device for wafer inspection, each of connector units 21 making up a connector device 20 is constructed by an anisotropically conductive elastomer sheet 23a and a pitch converting board 30 arranged on the anisotropically conductive elastomer sheet 23a and composed of, for example, a printed wiring board. In this embodiment, the anisotropically conductive elastomer sheet 23a has the same construction as the first anisotropically conductive elastomer sheet 22 in the circuit board device for wafer inspection shown in FIG. 1. The pitch converting board 30 also has the same constructions as that in the circuit board device for wafer inspection shown in FIG. 1.

According to such a circuit board device 11 for wafer inspection, the connector device 20 obtained by stacking a plurality of the connector units 21 having the pitch converting board 30 on each other is provided, so that the pitch converting board 30 in each connector unit 21 can be constructed by a single-layer wiring board or a multi-layer wiring board small in the number of layers, and such a wiring board can be produced with relative ease at a high yield, whereby the production cost of the whole circuit board device 11 for wafer inspection can be reduced.

<Probe Card>

Figure 22:
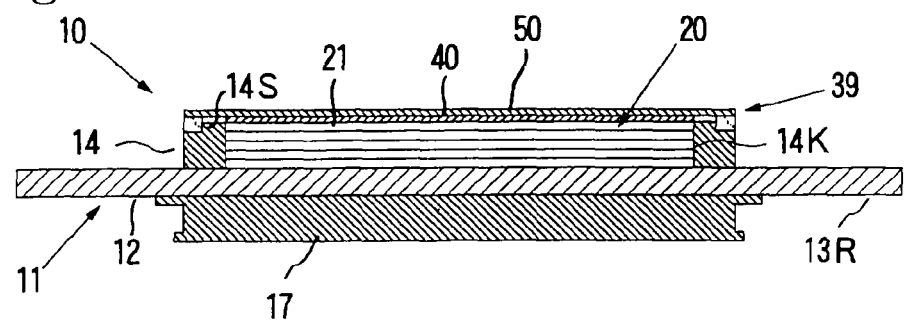
[FIG. 22] is a cross-sectional view illustrating the construction of a first exemplary probe card according to the present invention.

FIG. 22 is a cross-sectional view illustrating the construction of a first exemplary probe card according to the present invention. This first exemplary probe card 10 is used for collectively conducting electrical inspection on each of all integrated circuits formed on a wafer in a state of the wafer, and is constructed by the circuit board device 11 for wafer inspection shown in FIG. 1 and a contact member 39 arranged on one surface (upper surface in FIG. 22) of the circuit board device 11 for wafer inspection. The contact member 39 is constructed by an anisotropically conductive connector 40 and a sheet-like probe 50 arranged on the anisotropically conductive connector 40.

Figure 23:
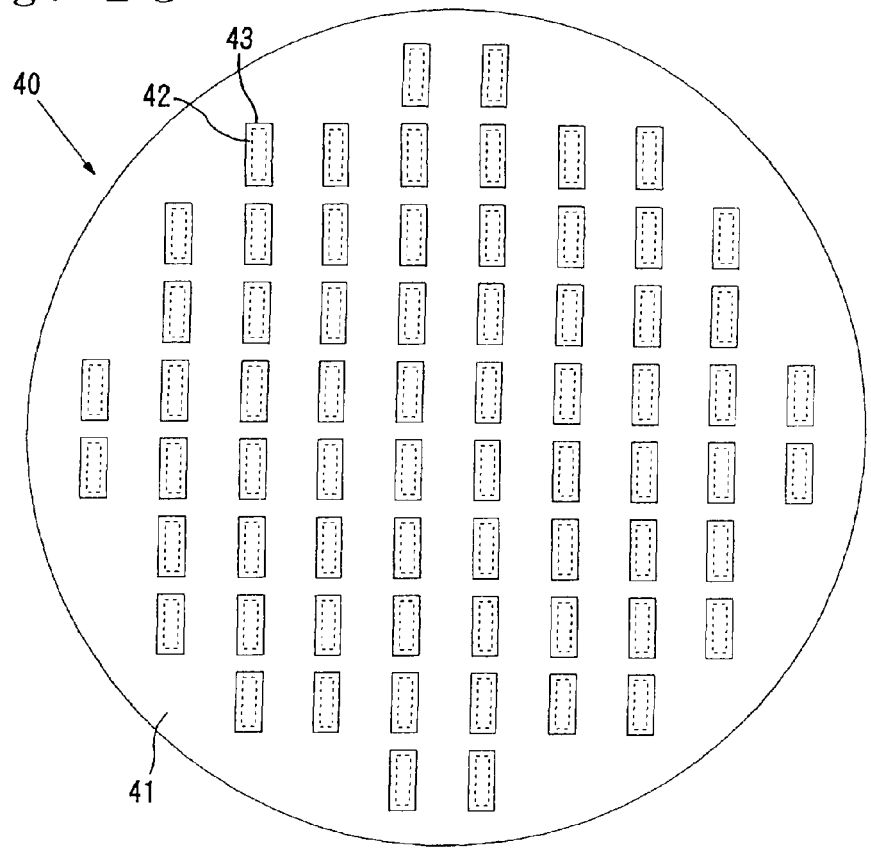
[FIG. 23] is a plan view of an anisotropically conductive connector in the first exemplary probe card.
Figure 24:
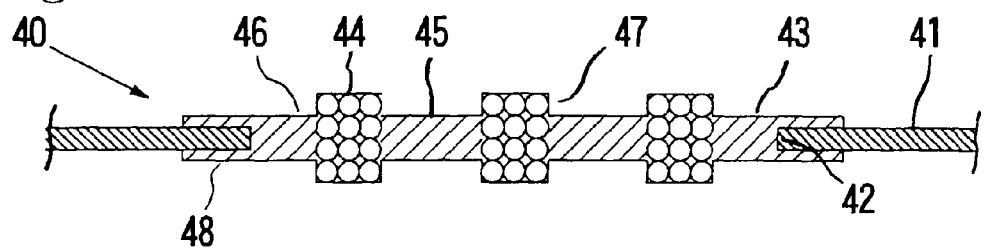
[FIG. 24] is a cross-sectional view illustrating, on an enlarged scale, a principal part of the anisotropically conductive connector in the first exemplary probe card.

FIG. 23 is a plan view of the anisotropically conductive connector 40 in the first exemplary probe card 10, and FIG. 24 is a cross-sectional view illustrating, on an enlarged scale, a principal part of the anisotropically conductive connector 40 shown in FIG. 23.

The anisotropically conductive connector 40 has a disk-like frame plate 41, in which a plurality of openings 42 each extending through in a thickness-wise direction of the frame plate have been formed. The openings 42 in this frame plate 41 are formed corresponding to a pattern of electrode regions, in which electrodes to be inspected in all integrated circuits formed on a wafer, which is an object of inspection, have been formed. In the frame plate 41, a plurality of elastic anisotropically conductive films 43 having conductivity in a thickness-wise direction thereof are arranged in a state supported by their corresponding opening edges of the frame plate 41 so as to close the respective openings 42.

Each of the elastic anisotropically conductive films 43 is formed of an elastic polymeric substance as a base material and has a functional part 46 composed of a plurality of conductive parts 44 for connection extending in a thickness-wise direction of the film and an insulating part 45 formed around the conductive parts 44 for connection and mutually insulating the conductive parts 44 for connection. The functional part 46 is arranged so as to be located in the opening 42 of the frame plate 41. The conductive parts 44 for connection in the functional part 46 are arranged in accordance with a pattern corresponding to a pattern of the electrodes to be inspected in an electrode region of an integrated circuit formed on the wafer, which is the object of inspection.

At a peripheral edge of the functional part 46, a part 48 to be supported, which is fixed to and supported by an edge portion of the opening in the frame plate 41, is formed integrally and continuously with the functional part 46. Specifically, the part 48 to be supported in this embodiment is shaped in a forked form and fixed and supported in a closely contacted state so as to grasp the edge portion of the opening in the frame plate 41.

In the conductive parts 44 for connection in the functional part 46 of the elastic anisotropically conductive film 43, conductive particles P exhibiting magnetism are densely contained in a state oriented so as to align in the thickness-wise direction. On the other hand, the insulating part 45 does not contain the conductive particles P at all or scarcely contain them.

In the illustrated embodiment, projected portions 47 protruding from other surfaces than portions, at which the conductive parts 44 for connection and peripheral portions thereof are located, are formed at those portions on both surfaces of the functional part 46 in the elastic anisotropically conductive film 43.

The thickness of the frame plate 41 varies according to the material thereof, but is preferably 20 to 600 μm, more preferably 40 to 400 μm.

If this thickness is smaller than 20 μm, the strength required upon use of the resulting anisotropically conductive connector 40 is not achieved, and the durability thereof is liable to become low. In addition, such stiffness as the form of the frame plate 41 is retained is not achieved, and the handling property of the anisotropically conductive connector 40 becomes low. If the thickness exceeds 600 μm on the other hand, the elastic anisotropically conductive films 43 formed in the openings 42 become too great in thickness, and it may be difficult in some cases to achieve good conductivity in the conductive parts 44 for connection and insulating property between adjoining conductive parts 44 for connection.

The form and size in a plane direction of the openings 42 in the frame plate 41 are designed according to the size, pitch and pattern of electrodes to be inspected in a wafer that is an object of inspection.

No particular limitation is imposed on a material for forming the frame plate 41 so far as it has such stiffness as the resulting frame plate 41 is hard to be deformed, and the form thereof is stably retained. For example, various kinds of materials such as metallic materials, ceramic materials and resin materials may be used. When the frame plate 41 is formed by, for example, a metallic material, an insulating film may also be formed on the surface of the frame plate 41.

Specific examples of the metallic material for forming the frame plate 41 include metals such as iron, copper, nickel, titanium and aluminum, and alloys or alloy steels composed of a combination of at least two of these metals.

As the material for forming the frame plate 41, is preferably used a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K.

Specific examples of such a material include invar alloys such as invar, Elinvar alloys such as Elinvar, and alloys or alloy steels such as superinvar, covar and 42 alloy.

The overall thickness (thickness of the conductive part 44 for connection in the illustrated embodiment) of each of the elastic anisotropically conductive films 43 is preferably 50 to 3,000 μm, more preferably 70 to 2,500 μm, particularly preferably 100 to 2,000 μm. When this thickness is 50 μm or greater, elastic anisotropically conductive films 43 having sufficient strength are provided with certainty. When this thickness is 3,000 μm or smaller on the other hand, conductive parts 43 for connection having necessary conductive properties are provided with certainty.

The total projected height of the projected portion 47 is preferably at least 10%, more preferably at least 20% of the thickness of the projected portion 47. Projected portions 47 having such a projected height are formed, whereby the conductive parts 44 for connection are sufficiently compressed with small pressurizing force, and so good conductivity is surely achieved.

The projected height of the projected portion 47 is preferably at most 100%, more preferably at most 70% of the shortest width or diameter of the projected portion 47. Projected portions 47 having such a projected height are formed, whereby the projected portions 47 are not buckled when they are pressurized, so that the expected conductivity is surely achieved.

The thickness (thickness of one of the forked portions in the illustrated embodiment) of the part 48 to be supported is preferably 5 to 600 μm, more preferably 10 to 500 μm, particularly preferably 20 to 400 μm.

It is not essential that the part 48 to be supported is formed in the forked form, and the elastic anisotropically conductive film may also be fixed to only one surface of the frame plate 41.

As the elastic polymeric substance forming the elastic anisotropically conductive films 43 and the conductive particles P making up the conductive parts 44 for connection, may be used those exemplified as the elastic polymeric substance and conductive particles making up the first anisotropically conductive sheet 22 and second anisotropically conductive elastomer sheet 23.

The proportion of the conductive particles P contained in the conductive parts 44 for connection of the functional part 46 is preferably 10 to 60%, more preferably 15 to 50% in terms of volume fraction. If this proportion is lower than 10%, conductive parts 44 for connection sufficiently low in electric resistance value may not be obtained in some cases. If this proportion exceeds 60% on the other hand, the resulting conductive parts 44 for connection are liable to be brittle, so that elasticity required of the conductive parts 44 for connection may not be achieved in some cases.

Such an anisotropically conductive connector 40 can be produced in accordance with the process described in, for example, Japanese Patent Application Laid-Open No. 2002-334732.

Figure 25:
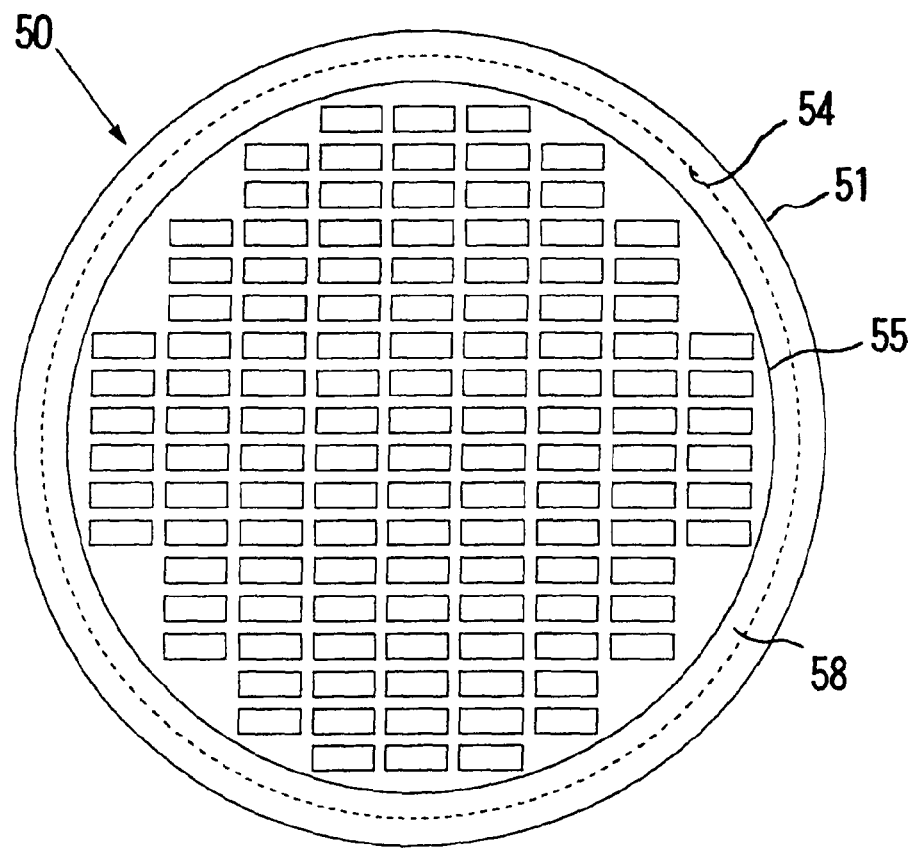
[FIG. 25] is a plan view of a sheet-like probe in the first exemplary probe card.
Figure 26:
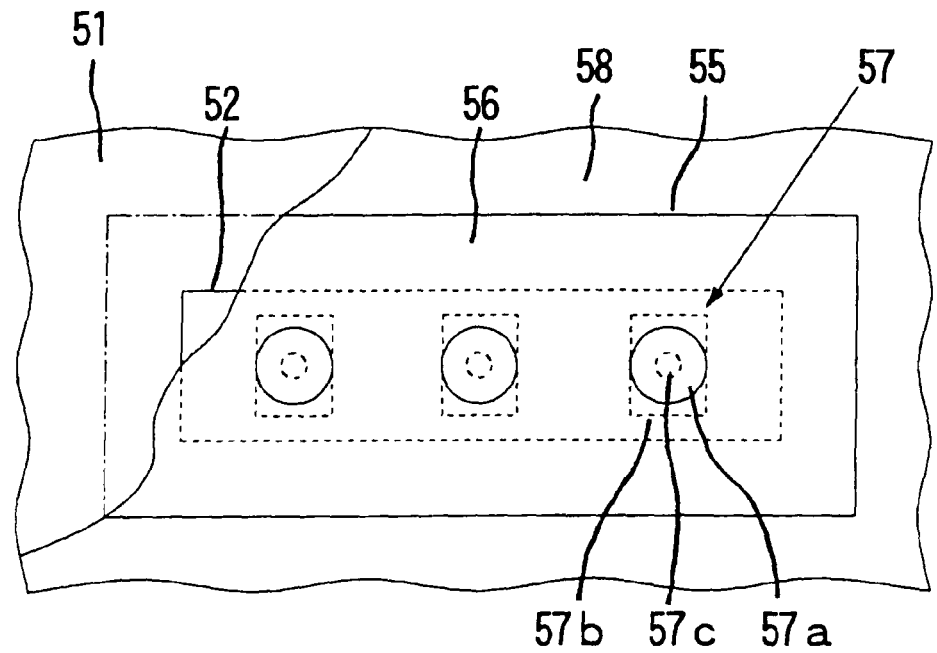
[FIG. 26] is a plan view illustrating, on an enlarged scale, a contact film of the sheet-like probe in the first exemplary probe card.
Figure 27:
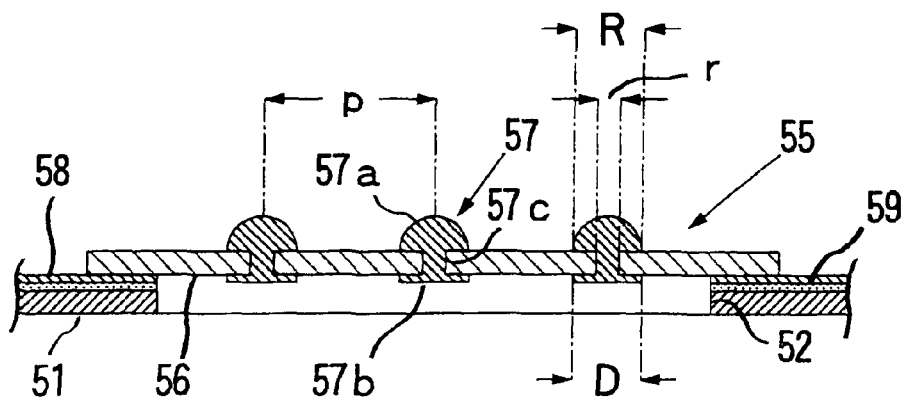
[FIG. 27] is a cross-sectional view illustrating, on an enlarged scale, the construction of the contact film of the sheet-like probe in the first exemplary probe card.

FIG. 25 is a plan view illustrating the sheet-like probe 50 in the first exemplary probe card 10, and FIG. 26 and FIG. 27 are a plan view and a cross-sectional view illustrating, on an enlarged scale, a contact film in the sheet-like probe 50, respectively.

Figure 28:
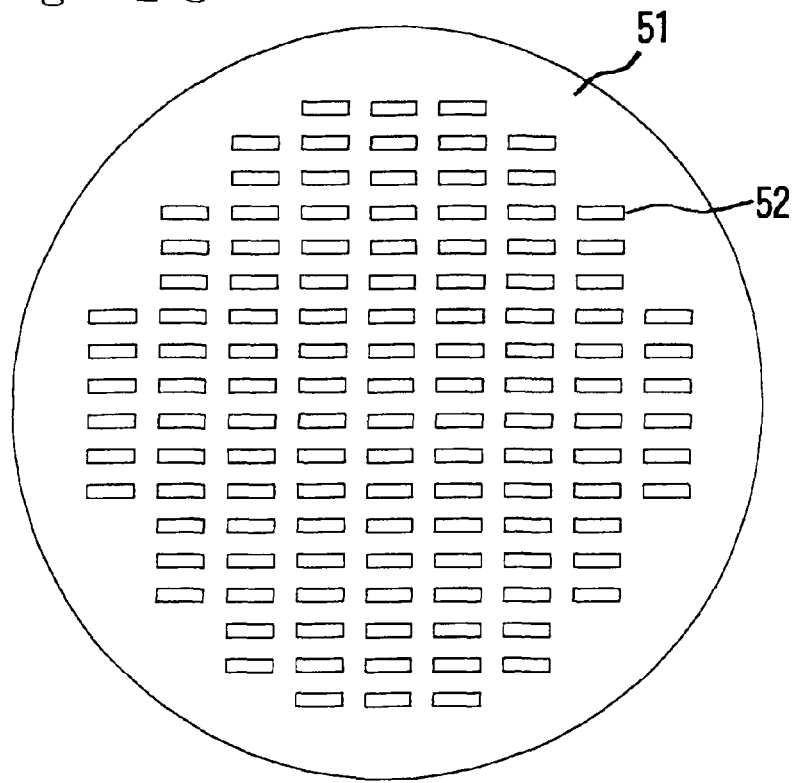
[FIG. 28] is a plan view illustrating a frame plate of the sheet-like probe in the first exemplary probe card.

The sheet-like probe 50 has a metal-made circular frame plate 51, in which a plurality of openings 52 have been formed, as also illustrated in FIG. 28. The openings 52 in this frame plate 51 are formed corresponding to the pattern of electrode regions, in which the electrodes to be inspected in all the integrated circuits formed on the wafer, which is the object of inspection, have been formed.

As a metal for forming the frame plate 51, may be used iron, copper, nickel, titanium, or an alloy or alloy steel thereof. However, an iron-nickel alloy steel such as 42 alloy, invar or covar is preferred in that the openings 52 can be easily formed by an etching treatment in a production process, which will be described subsequently.

As the frame plate 51, is preferably used a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K.

Specific examples of such a material for forming the frame plate 51 include invar alloys such as invar, Elinvar alloys such as Elinvar, and alloys or alloy steels such as superinvar, covar and 42 alloy.

The thickness of the frame plate 51 is preferably 10 to 200 µm, more preferably 10 to 150 µm.

If this thickness is too small, the strength required of the frame plate for supporting the resulting contact films 55 may not be achieved in some cases. If this thickness is too great on the other hand, it may be difficult in some cases to form the openings 52 with high dimensional precision by an etching treatment in the production process, which will be described subsequently.

A metal film 58 is integrally formed on one surface of the frame plate 51 through an adhesive layer 59, and a plurality of the contact films 55 are arranged and fixed on this metal film 58 so as to close the openings 52 of the frame plate 51, whereby each of the contact films 55 is supported by the frame plate 51 through the adhesive layer 59 and metal film 58. On the other surface of the frame plate 51, a circular ring-like holding member 54 is arranged along a peripheral edge portion of the frame plate 51, and the frame plate 51 is held by the holding member 54.

The metal film 58 is formed by the same material as that of back-surface electrode parts 57*b* in electrode structures 57, which will be described subsequently.

As a material forming the adhesive layer 59, may be used a silicone rubber adhesive, epoxy adhesive, polyimide adhesive, cyanoacrylate adhesive, polyurethane adhesive or the like.

As a material forming the holding member 54, may be used an invar alloy such as invar or superinvar, an Elinvar alloy such as Elinvar, a low-thermal expansion metal material such as covar or 42 alloy, a ceramic material such as alumina, silicon carbide or silicon nitride, or the like.

Each of the contact films 55 has a flexible insulating film 56, and in this insulating film 56, a plurality of electrode structures 57 each extending in a thickness-wise direction of the insulating film 56 and composed of a metal are arranged in relation separated from each other in a plane direction of the insulating film 56 in accordance with a pattern corresponding to a pattern of electrodes to be inspected in an electrode region of an integrated circuit formed on the wafer that is the object of inspection. The contact film 55 is arranged in such a manner that the respective electrode structures 57 are located in the opening 52 of the frame plate 51.

Each of the electrode structures 57 is constructed by integrally linking a projected front-surface electrode part 57*a* exposed to a front surface of the insulating film 56 and a plate-like back-surface electrode part 57*b* exposed to a back surface of the insulating film 56 to each other through a short circuit part 57*c* extending through in the thickness-wise direction of the insulating film 56.

No particular limitation is imposed on a material for forming the insulating films 56 so far as it has insulating property and is flexible, and a resin material such as polyimide or liquid crystal polymer, or a composite material thereof may be used. However, polyimide is preferably used in that through-holes for the electrode structures can be easily formed by an etching treatment in the production process, which will be described subsequently.

As other materials for forming the insulating films 56, may be used meshes or nonwoven fabrics, or those obtained by impregnating these with a resin or elastic polymeric substance. As fibers for forming such meshes or nonwoven fabrics, may be used organic fibers such as aramide fiber, polyethylene fiber, polyarylate fiber, nylon fiber, fluorocarbon resin fibers such as Teflon (trademark) fiber, and polyester fiber. Such a material is used as a material for forming the insulating films 56, whereby the flexibility of the whole contact film 55 is not greatly deteriorated even when the electrode structures 57 are arranged at a small pitch, so that a possible scatter of projected height in the electrode structures 57 or projected height in the electrodes to be inspected is sufficiently absorbed by the flexibility that the contact film 55 has, and so stable electrical connection to each of the electrodes to be inspected can be surely achieved.

No particular limitation is imposed on the thickness of the insulating film 56 so far as the flexibility of the insulating film 56 is not impaired. However, it is preferably 5 to 150 µm, more preferably 7 to 100 µm, still more preferably 10 to 50 µm.

As a material for forming the electrode structures 57, may be used nickel, iron, copper, gold, silver, palladium, iron, cobalt, tungsten, rhodium, or an alloy or alloy steel thereof. The electrode structures 57 may be any of those formed of a simple metal as a whole, those formed of an alloy or alloy steel of at least two metals and those obtained by laminating at least two metals.

When electrical inspection is conducted on electrodes to be inspected, on the surfaces of which an oxide film has been formed, it is necessary to bring each of the electrode structures 57 of the sheet-like probe 50 into contact with its corresponding electrode to be inspected to break the oxide film on the surface of the electrode to be inspected by the front-surface electrode part 57*a* of the electrode structure 57, thereby achieving electrical connection between the electrode structure 57 and the electrode to be inspected. Therefore, the front-surface electrode part 57*a* of the electrode structure 57 preferably has such hardness that the oxide film can be easily broken. In order to obtain such front-surface electrode parts 57*a*, a powdery material having high hardness may be contained in a metal forming the front-surface electrode parts 57*a*.

As such a powdery material, may be used diamond powder, silicon nitride, silicon carbide, ceramic, glass or the like. A proper amount of such a non-conductive powdery material is contained, whereby the oxide film formed on the surface of the electrode to be inspected can be broken by the front-surface electrode part 57*a* of the electrode structure 57 without impairing the conductivity of the electrode structure 57.

In order to easily break the oxide film on the surface of the electrode to be inspected, the front-surface electrode part 57*a* in the electrode structure 57 may be shaped into a sharply projected form, or fine irregularities may be formed in the surface of the front-surface electrode part 57*a*.

A pitch p between the electrode structures 57 in the contact film 55 is preset according to a pitch between the electrodes to be inspected in the wafer, which is the object of inspection, and is, for example, preferably 40 to 250 µm, more preferably 40 to 150 µm.

The term "pitch between electrode structures" as used herein means the shortest center distance between adjoining electrode structures.

In the electrode structure 57, a ratio of the projected height to the diameter R in the front-surface electrode part 57a is preferably 0.2 to 3, more preferably 0.25 to 2.5. By satisfying such conditions, electrode structures 57 of a pattern corresponding to a pattern of electrodes to be inspected can be easily formed even when the electrodes to be inspected are small in pitch and fine, and a stable electrically connected state to such a wafer can be surely achieved.

The diameter R of the front-surface electrode part 57a is preferably 1 to 3 times, more preferably 1 to 2 times as large as the diameter r of the short circuit part 57c.

The diameter R of the front-surface electrode part 57a is also preferably 30 to 75%, more preferably 40 to 60% of the pitch p between the electrode structures 57.

The outer diameter D of each back-surface electrode part 57b is only required to be greater than the diameter r of the short circuit part 57c and smaller than the pitch p between the electrode structures 57, and is preferably great as much as possible. Stable electrical connection to the anisotropically conductive connector 40 can be thereby achieved with certainty.

The diameter r of the short circuit part 57c is preferably 15 to 75%, more preferably 20 to 65% of the pitch p between the electrode structures 57.

The specific dimensions of each of the electrode structures 57 will be described. The projected height of the front-surface electrode part 57a is preferably 15 to 50 μm, more preferably 15 to 30 μm in that stable electrical connection to its corresponding electrode to be inspected can be achieved.

The diameter R of the front-surface electrode part 57a is preset in view of the above-described conditions, the diameter of its corresponding electrode to be inspected, and the like. However, it is, for example, preferably 30 to 200 μm, more preferably 35 to 150 μm.

The diameter r of the short circuit part 57c is preferably 10 to 120 μm, more preferably 15 to 100 μm in that sufficiently high strength is achieved.

The thickness of the back-surface electrode part 57b is preferably 15 to 150 μm, more preferably 20 to 100 μm in that sufficiently high strength and excellent repetitive durability are achieved.

A coating film may be formed on the front-surface electrode part 57a and back-surface electrode part 57b in each of the electrode structures 57 as needed. When the electrodes to be inspected are formed of, for example, a solder material, a coating film composed of a diffusion-resistant metal such as silver, palladium or rhodium is preferably formed on the front-surface electrode part 57a from the viewpoint of preventing the solder material from diffusing.

The sheet-like probe 50 is arranged in such a manner that the back-surface electrode part 57b in each of the electrode structures 57 brings into contact with its corresponding conductive part 44 for connection of the anisotropically conductive connector 40, and the holding member 54 is interlocked with and fixed to the step portion 14S of the holder 14 in the circuit board device 11 for wafer inspection.

Such a sheet-like probe 50 can be produced in the following manner.

Figure 29:
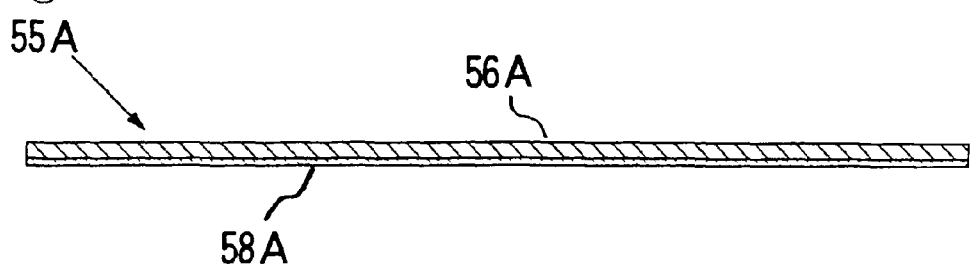
[FIG. 29] is a cross-sectional view illustrating the construction of a laminate used for producing the sheet-like probe.

As illustrated in FIG. 29, a circular laminate 55A with a resin sheet 56A for insulating films integrally laminated on one surface of a metal foil 58A for back-surface electrode parts, which is composed of the same material as back-surface electrode parts 57b in electrode structures 57 to be formed, is first provided.

Figure 30:
[FIG. 30] is a cross-sectional view illustrating a state that a protecting tape has been arranged on a peripheral edge portion of the frame plate.

On the other hand, as illustrated in FIG. 30, a circular frame plate 51, in which a plurality of openings 52 has been formed corresponding to a pattern of electrode regions, in which electrodes to be inspected of integrated circuits formed on a wafer, which is an object of inspection, have been formed, is produced, and a protecting tape 60 is arranged on one surface of this frame plate 51 along a peripheral edge portion thereof. As a method for forming the openings 52 in the frame plate 51, may be utilized an etching method or the like.

Figure 31:
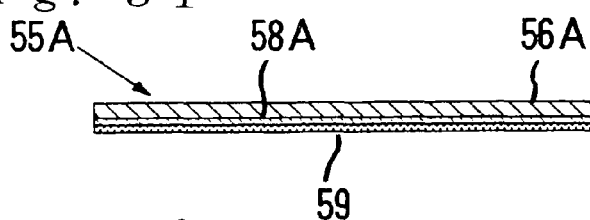
[FIG. 31] is a cross-sectional view illustrating a state that an adhesive layer has been formed on a metal foil for back-surface electrode parts in the laminate shown in FIG. 29.
Figure 32:
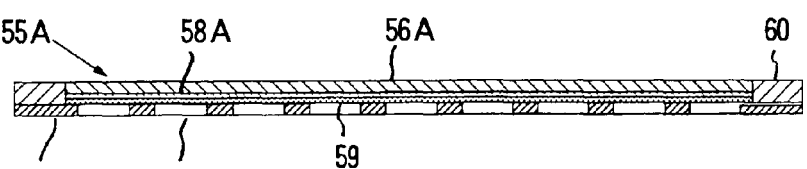
[FIG. 32] is a cross-sectional view illustrating a state that the frame plate has been bonded to the metal foil for back-surface electrode parts in the laminate.
Figure 33:
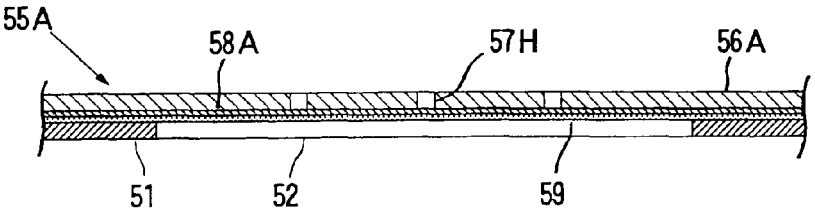
[FIG. 33] is a cross-sectional view illustrating a state that through-holes have been formed in a resin sheet for insulating films in the laminate.

As illustrated in FIG. 31, an adhesive layer 59 composed of, for example, an adhesive resin is then formed on the other surface of the metal foil 58A for back-surface electrode parts in the laminate 55A, and the frame plate 51, on which the protecting tape 60 has been provided, is bonded thereto as illustrated in FIG. 32. Thereafter, as illustrated in FIG. 33, a plurality of through-holes 57H each extending through in a thickness-wise direction of the resin sheet are formed in the resin sheet 56A for insulating films in the laminate 55A in accordance with a pattern corresponding to a pattern of the electrode structures 57 to be formed. As a method for forming the through-holes 57H in the resin sheet 56 for insulating films, may be utilized laser beam machining, etching or the like.

Figure 34:
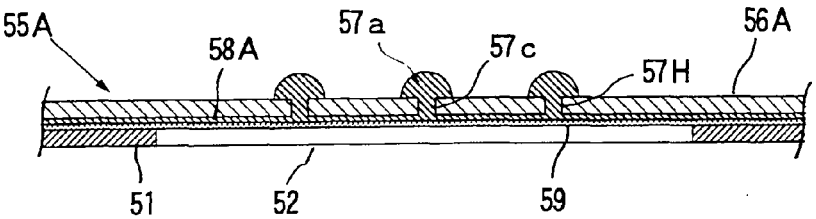
[FIG. 34] is a cross-sectional view illustrating a state that short circuit parts and front-surface electrode parts have been formed in the resin sheet for insulating films.
Figure 35:
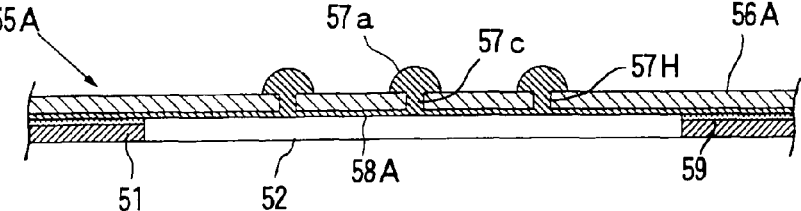
[FIG. 35] is a cross-sectional view illustrating a state that a part of the adhesive layer has been removed to expose the metal foil for back-surface electrode parts.
Figure 36:
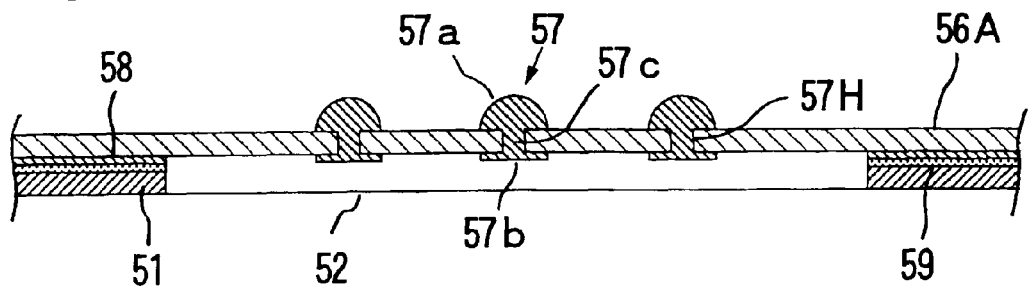
[FIG. 36] is a cross-sectional view illustrating a state that back-surface electrode parts have been formed.
Figure 37:
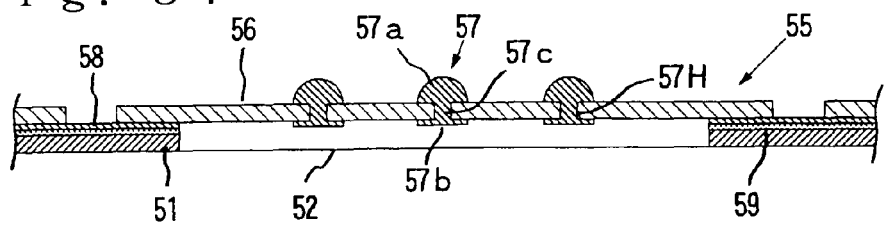
[FIG. 37] is a cross-sectional view illustrating a state that insulating films have been formed.

Then, the back surface and openings 52 of the frame plate 51 in the laminate 55A are covered with a protecting tape (not illustrated), and the metal foil 58A for back-surface electrode parts in the laminate 55A is subjected to a plating treatment, thereby respectively forming short circuit parts 57c integrally linked to the metal foil 58A for back-surface electrode parts within the through-holes 57H formed in the resin sheet 56A for insulating films and at the same time, forming front-surface electrode parts 57a integrally linked to the respective short circuit parts 57c and protruding from the surface of the resin sheet 56A for insulating films as illustrated in FIG. 34. Thereafter, the protecting tape is removed from the back surface of the frame plate 51, and portions of the adhesive layer 59, which are exposed to the openings 52 in the frame plate 51, are removed as illustrated in FIG. 35, thereby exposing parts of the metal foil 58A for back-surface electrode parts. The exposed parts of the metal foil 58A for back-surface electrode parts are subjected to an etching treatment, thereby forming a plurality of back-surface electrode parts 57b integrally linked to the respective short circuit parts 57c as illustrated in FIG. 36, thus forming electrode structures 57. The resin sheet 56A for insulating films is then subjected to an etching treatment to remove a part thereof, thereby forming a plurality of insulating films 56 independent of one another as illustrated in FIG. 37, thus forming a plurality of contact films 55, in each of which a plurality of the electrode structures 57 each extending through in the thickness-wise direction of the insulating film 56 is arranged.

The protecting tape 60 (see FIG. 30) is removed from the peripheral edge portion of the frame plate 51, and a holding member is then arranged and fixed to a peripheral edge portion on the back surface of the frame plate 51, thereby obtaining the sheet-like probe 50 illustrated in FIG. 25 to FIG. 27.

According to such a first exemplary probe card 10, the circuit board devices 11 for wafer inspection shown in FIG. 1 is provided, so that said probe card 10 can be produced at low cost, and high connection reliability can be achieved.

Figure 38:
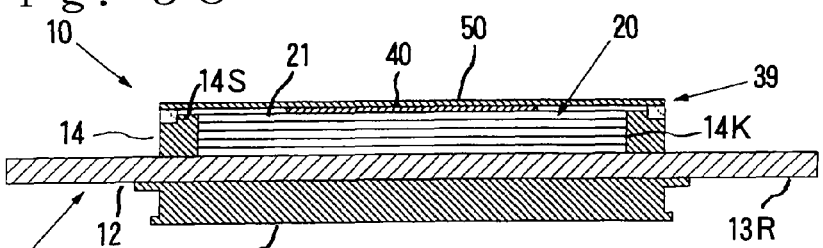
[FIG. 38] is a cross-sectional view illustrating the construction of a second exemplary probe card according to the present invention.

FIG. 38 is a cross-sectional view illustrating the construction of a second exemplary probe card according to the present invention.

This second exemplary probe card 10 is used for collectively conducting electrical inspection on each of some integrated circuits among integrated circuits formed on, for example, a wafer in a state of the wafer, and is constructed by the circuit board device 11 for wafer inspection shown in FIG. 19 and a contact member 39 arranged on one surface (upper surface in FIG. 38) of the circuit board device 11 for wafer inspection. The contact member 39 is constructed by an anisotropically conductive connector 40 and a sheet-like probe 50 arranged on the anisotropically conductive connector 40.

Figure 39:
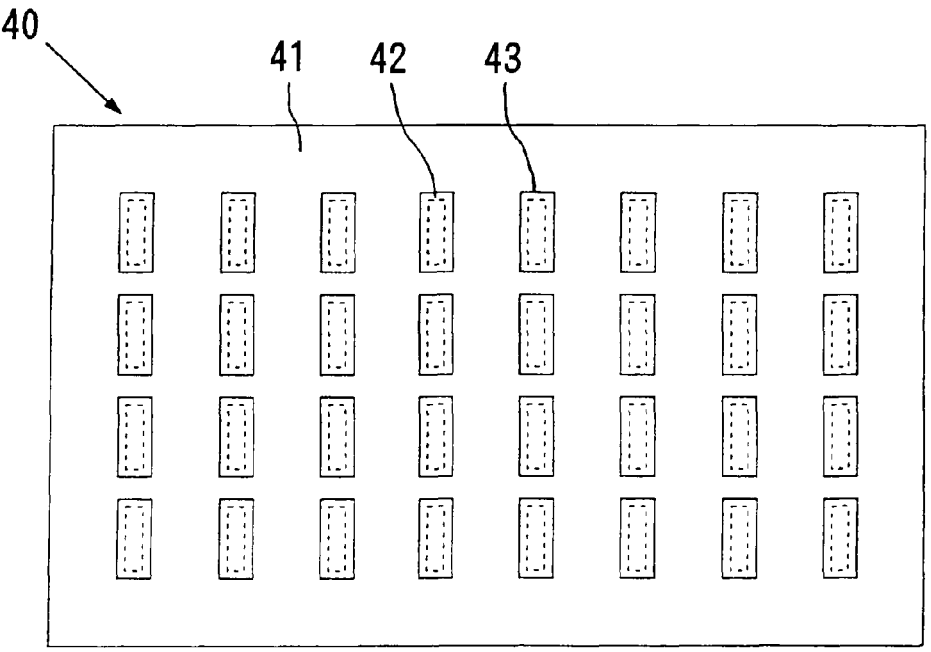
[FIG. 39] is a plan view of an anisotropically conductive connector in the second exemplary probe card.

As illustrated in FIG. 39, the anisotropically conductive connector 40 has a rectangular plate-like frame plate 41, in which a plurality of openings 42 each extending through in a thickness-wise direction of the frame plate have been formed. The openings 42 in this frame plate 41 are formed corresponding to a pattern of electrode regions, in which electrodes to be inspected in, for example, thirty-two (8×4) integrated circuits among the integrated circuits formed on the wafer, which is the object of inspection, have been formed. In the frame plate 41, a plurality of elastic anisotropically conductive films 43 having conductivity in a thickness-wise direction thereof is arranged in a state supported by their corresponding opening edges of the frame plate 41 so as to close the respective openings 42. Other constructions in the anisotropically conductive connector 40 are the same as those in the anisotropically conductive connector 40 in the first exemplary probe card 10 (see FIG. 24).

Figure 40:
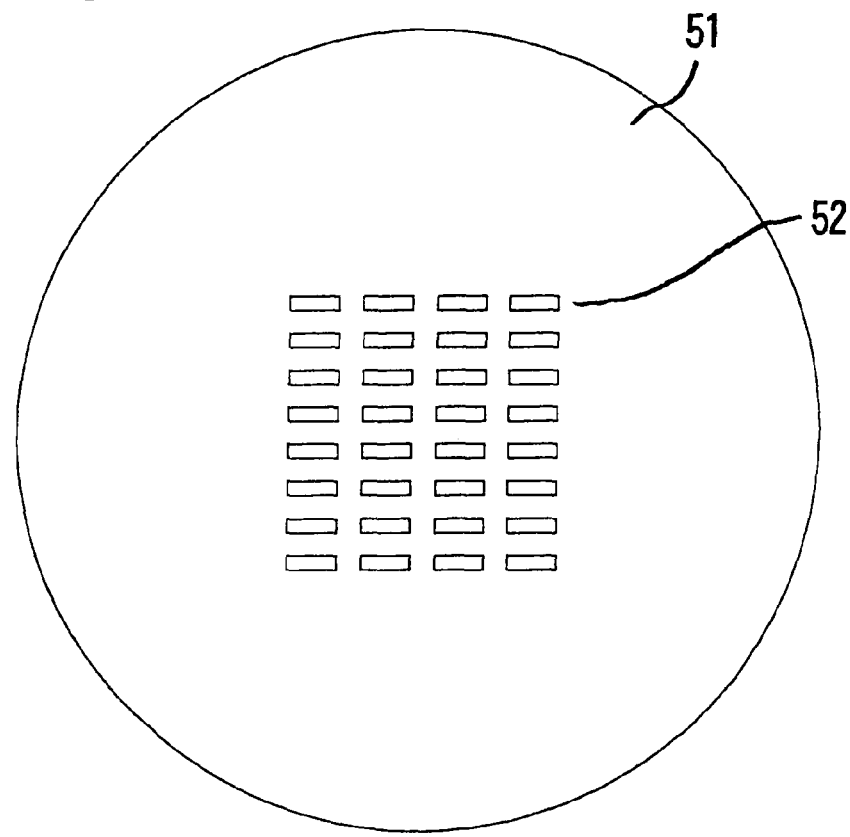
[FIG. 40] is a plan view illustrating a frame plate of a sheet-like probe in the second exemplary probe card.

The sheet-like probe 50 has such a metal-made frame plate 51, in which a plurality of openings 52 have been formed, as illustrated in FIG. 40. The openings 52 in this frame plate 51 are formed corresponding to a pattern of electrode regions, in which electrodes to be inspected in, for example, thirty-two (8×4) integrated circuits among the integrated circuits formed on the wafer, which is the object of inspection, have been formed. Other constructions in this sheet-like probe 50 are the same as those in the sheet-like probe 50 in the first exemplary probe card 10 (see FIG. 26 and FIG. 27).

The sheet-like probe 50 can be produced in the same manner as in the sheet-like probe 50 in the first exemplary probe card 10.

The sheet-like probe 50 is arranged in such a manner that the back-surface electrode part 57b in each of the electrode structures 57 brings into contact with its corresponding conductive part 44 for connection of the anisotropically conductive connector 40, and the holding member 54 is interlocked with and fixed to the step portion 14S of the holder 14 in the circuit board device 11 for wafer inspection.

According to such a second exemplary probe card 10, the circuit board device 11 for wafer inspection shown in FIG. 19 is provided, so that said probe card 10 can be produced at low cost, and high connection reliability can be achieved.

[Wafer Inspection Apparatus]

Figure 41:
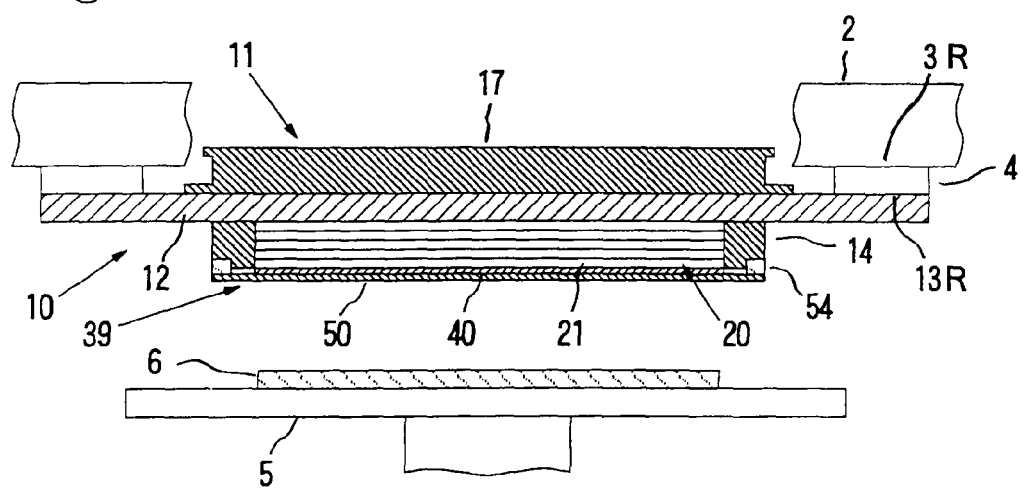
[FIG. 41] is a cross-sectional view illustrating the construction of a first exemplary wafer inspection apparatus according to the present invention.
Figure 42:
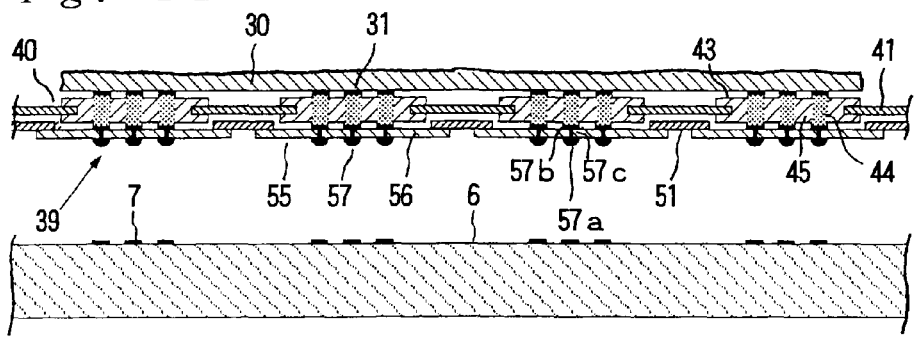
[FIG. 42] is a cross-sectional view illustrating, on an enlarged scale, the construction of a principal part of the first exemplary wafer inspection apparatus.

FIG. 41 is a cross-sectional view schematically illustrating the construction of a first exemplary wafer inspection apparatus according to the present invention, and FIG. 42 is a cross-sectional view illustrating, on an enlarged scale, the construction of a principal part of the first exemplary wafer inspection apparatus. This first exemplary wafer inspection apparatus serves to collectively perform electrical inspection, for example, a burn-in test on each of all integrated circuits formed on a wafer in a state of the wafer.

Figure 43:
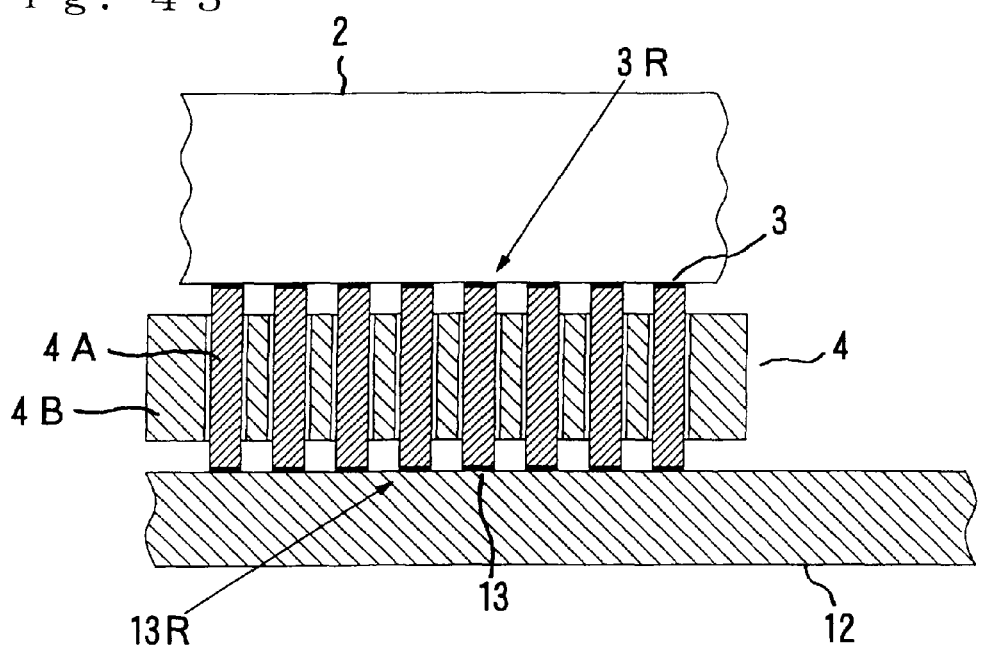
[FIG. 43] is a cross-sectional view illustrating, on an enlarged scale, a connector in the first exemplary wafer inspection apparatus.

The first exemplary wafer inspection apparatus has a controller 2 serving to make temperature control of a wafer 6, which is an object of inspection, supply an electric power for conducting the inspection of the wafer 6, make input-output control of signals and detect output signals from the wafer 6 to judge the quality of integrated circuits on the wafer 6. As illustrated in FIG. 43, the controller 2 has, on a lower surface thereof, an input-output terminal part 3R, in which a great number of input-output terminals 3 are arranged along a circumferential direction thereof.

The first exemplary probe card 10 is arranged below the controller 2 in a state held by a proper holding means in such a manner that each of the lead electrodes 13 formed on the board body 12 in the circuit board device 11 for wafer inspection is opposed to its corresponding input-output terminal 3 of the controller 2.

A connector 4 is arranged between the input-output terminal part 3R of the controller 2 and the lead electrode part 13R of the circuit board device 11 for wafer inspection in the probe card 10, and each of the lead electrodes 13 of the circuit board device 11 for wafer inspection is electrically connected to its corresponding input-output terminal 3 of the controller 2 through the connector 4. The connector 4 in the illustrated embodiment is constructed by a plurality of conductive pins 4A capable of being elastically compressed in a lengthwise direction thereof and a supporting member 4B for supporting these conductive pins 4A, and each of the conductive pins 4A is arranged so as to be located between the input-output terminal 3 of the controller 2 and the lead electrode 13 formed on the board body 12.

A wafer mounting table 5, on which the wafer 6 that is the object of inspection is mounted, is provided below the probe card 10.

In such a wafer inspection apparatus, the wafer 6, which is the object of inspection, is mounted on the wafer mounting table 5, and the probe card 10 is then pressurized downward, whereby the respective front-surface electrode parts 57a in the electrode structures 57 of the sheet-like probe 50 thereof are brought into contact with their corresponding electrodes 7 to be inspected of the wafer 6, and moreover the respective electrodes 7 to be inspected of the wafer 6 are pressurized by the front-surface electrodes parts 57a. In this state, the conductive parts 44 for connection in the elastic anisotropically conductive films 43 of the anisotropically conductive connector 40 are respectively pinched by the connecting electrodes 31 of the circuit board device 11 for wafer inspection and the back-surface electrode parts 57b of the electrode structures 57 of the sheet-like probe 50 and compressed in the thickness-wise direction, whereby conductive paths are formed in the respective conductive parts 44 for connection in the thickness-wise direction thereof. As a result, electrical connection between the electrodes 7 to be inspected of the wafer 6 and the connecting electrodes 31 of the circuit board device 11 for wafer inspection is achieved. Thereafter, the wafer 6 is heated to a predetermined temperature through the wafer mounting table 5, and in this state, necessary electrical inspection is carried out on each of the integrated circuits on the wafer 6.

According to the first exemplary wafer inspection apparatus, the above-described first exemplary probe card 10 is provided, so that inspection cost can be reduced, and moreover the inspection can be performed on the wafer 6 with high reliability.

Figure 44:
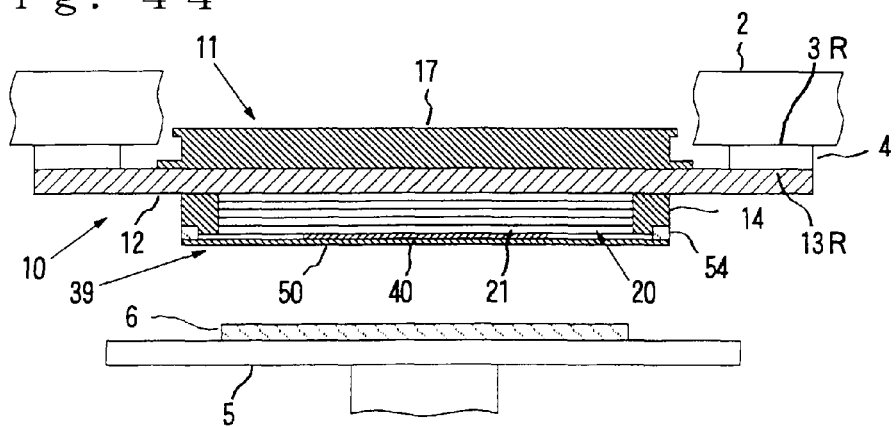
[FIG. 44] is a cross-sectional view illustrating the construction of a second exemplary wafer inspection apparatus according to the present invention.

FIG. 44 is a cross-sectional view schematically illustrating the construction of a second exemplary wafer inspection apparatus according to the present invention, and this wafer inspection apparatus serves to perform electrical inspection, for example, a probe test on each of some integrated circuits among integrated circuits formed on a wafer in a state of the wafer.

This second exemplary wafer inspection apparatus fundamentally has the same construction as the first exemplary wafer inspection apparatus except that the second exemplary probe card 10 is used in place of the first exemplary probe card 10.

In this second exemplary wafer inspection apparatus, the probe card 10 is electrically connected to electrodes 7 to be inspected of, for example, thirty-two integrated circuits selected from among all integrated circuits formed on a wafer 6 to conduct inspection. Thereafter, the probe card 10 is electrically connected to electrodes 7 to be inspected of a plurality of integrated circuits selected from among other integrated circuits to conduct inspection. These processes are repeated, whereby the probe test is conducted on all the integrated circuits formed on the wafer 6.

According to such a second exemplary wafer inspection apparatus, electrical connection to the electrodes 7 to be inspected of the wafer 6, which is the object of inspection, is achieved through the second exemplary probe card 10, and so a good electrically connected state to the wafer 6 can be surely achieved. In addition, the good electrically connected state to the wafer 6 can be stably retained. Accordingly, in the probe test on the wafer 6, necessary electrical inspection on the wafer 6 can be surely performed.

According to the first exemplary wafer inspection apparatus, the above-described first exemplary probe card 10 is provided, so that inspection cost can be reduced, and moreover the inspection can be performed on the wafer 6 with high reliability.

The present invention is not limited to the embodiments described above, and various changes or modifications can be added thereto as described below.

(1) In the circuit board device for wafer inspection shown in FIG. 19, each of the connector units in the connector device 20 may be constructed by the first anisotropically conductive elastomer sheet, the composite conductive sheet arranged on the first anisotropically conductive elastomer sheet, the plate-like spacer member provided on the composite conductive sheet, the second anisotropically conductive elastomer sheet arranged on the spacer member and the pitch converting board arranged on the second anisotropically conductive elastomer sheet and composed of the wiring board having connecting electrodes on a front surface thereof and terminal electrodes on a back surface thereof (see FIG. 20), or by the anisotropically conductive elastomer sheet and the pitch converting board arranged on the anisotropically conductive elastomer sheet and composed of the wiring board having connecting electrodes on a front surface thereof and terminal electrodes on a back surface thereof (see FIG. 21).

(2) In the probe card 10 shown in FIG. 22, the circuit board device 11 for wafer inspection may be that having the construction shown in FIG. 20 or that having the construction shown in FIG. 21. In the probe card shown in FIG. 38, the circuit board device 11 for wafer inspection may have the connector device 20 described in the item (1).

(3) In the anisotropically conductive connector 40 of the probe card 10, it is not essential that the projected portions are formed in the elastic anisotropically conductive films 43, and the whole surface of each of the elastic anisotropically conductive films 43 may be flat.

(4) In addition to the conductive parts 44 for connection formed in accordance with the pattern corresponding to the pattern of the electrodes to be inspected, conductive parts for non-connection that are not electrically connected to any electrode to be inspected may be formed in the elastic anisotropically conductive films 43 in the anisotropically conductive connector 40.

(5) The sheet-like probe 40 may be that of the construction having an insulating sheet, in which a single opening has been formed, and an insulating film arranged so as to close the opening in the insulating sheet, that of the construction having an insulating sheet, in which a plurality of openings have been formed, and a plurality of insulating films arranged so as to close the respective openings in the insulating sheet, or that of the construction having an insulating sheet, in which a plurality of openings have been formed, and one or more insulating films arranged so as to close one opening in the insulating sheet or one or more insulating films arranged so as to close two or more openings in the insulating sheet.

(6) The contact member is not limited to that of the flat type composed of the anisotropically conductive connector and the sheet-like probe, and that of a cantilever type or vertical needle type may be used.

(7) In the wafer inspection apparatus shown in FIG. 41 or the wafer inspection apparatus shown in FIG. 44, the probe card 10 may have the circuit board device for wafer inspection described in the above item (2).

(8) The connector 4 for electrically connecting the controller 2 to the circuit board device 11 for wafer inspection in the wafer inspection apparatus is not limited to that illustrated in FIG. 43, and those having various structures may be used.

The invention claimed is:

1. A circuit board device for wafer inspection used for conducting electrical inspection of a plurality of integrated circuits formed on a wafer in a state of the wafer and comprising
    a board body composed of a wiring board having connecting electrodes on a front surface thereof, and a connector device provided on the front surface of the board body and comprising a plurality of connector units stacked on each other, wherein
    each of the connector units in the connector device has a first anisotropically conductive elastomer sheet, a composite conductive sheet arranged on the first anisotropically conductive elastomer sheet, a second anisotropically conductive elastomer sheet arranged on the composite conductive sheet and a pitch converting board arranged on the second anisotropically conductive elastomer sheet and composed of a wiring board having connecting electrodes on a front surface thereof and terminal electrodes on a back surface thereof, wherein
    the composite conductive sheet has an insulating sheet, in which a plurality of through-holes each extending in a thickness-wise direction of the insulating sheet have been formed, and rigid conductors respectively arranged into the through-holes in the insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, and wherein
    each of the connecting electrodes in the board body is connected to the terminal electrodes in the pitch converting board of a first of the plurality of the connector devices through the anisotropically conductive elastomer of the first of the plurality of connector devices, and the connecting electrodes in the pitch converting board of the first of the plurality of connector devices is electrically connected to the terminal electrodes in the pitch converting board of a second of the plurality of the connector devices through the anisotropically conductive elastomer of the second of the plurality of connector devices, the pitch converting board in each of the first and second connector devices being arranged just above its respective anisotropically conductive elastomer sheet.

2. A circuit board device for wafer inspection used for conducting electrical inspection of a plurality of integrated circuits formed on a wafer in a state of the wafer and comprising a board body composed of a wiring board having connecting electrodes on a front surface thereof, and a connector device provided on the front surface of the board body and comprising a plurality of connector units stacked on each other, wherein each of the connector units in the connector device has a first anisotropically conductive elastomer sheet, a composite conductive sheet arranged on the first anisotropically conductive elastomer sheet, a plate-like spacer member provided on the composite conductive sheet, a second anisotropically conductive elastomer sheet arranged on the spacer member and a pitch converting board arranged on the second anisotropically conductive elastomer sheet and composed of a wiring board having connecting electrodes on a front surface thereof and terminal electrodes on a back surface thereof, wherein the composite conductive sheet has an insulating sheet, in which a plurality of through-holes each extending in a thickness-wise direction of the insulating sheet have been formed, and rigid conductors respectively arranged into the through-holes in the insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, wherein in the spacer member, a plurality of openings having a diameter greater than the diameter of the terminal portion in the rigid conductor is formed at positions corresponding to the respective rigid conductors in the composite conductive sheet, and wherein each of the connecting electrodes in the board body is connected to the terminal electrodes in the pitch converting board of a first of the plurality of the connector devices through the anisotropically conductive elastomer of the first of the plurality of connector devices, and the connecting electrodes in the pitch converting board of the first of the plurality of connector devices is electrically connected to the terminal electrodes in the pitch converting board of a second of the plurality of the connector devices through the anisotropically conductive elastomer of the second of the plurality of connector devices, the pitch converting board in each of the first and second connector devices being arranged just above its respective anisotropically conductive elastomer sheet.

3. The circuit board device for wafer inspection according to claim 1 or 2, wherein a movable distance of each rigid conductor in the thickness-wise direction of the insulating sheet in the composite conductive sheet is 5 to 50 μm.

4. The circuit board device for wafer inspection according to claim 1 or 2, wherein each of the first anisotropically conductive elastomer sheet and second anisotropically conductive elastomer sheet is such that conductive particles exhibiting magnetism are contained in an elastic polymeric substance in a state oriented so as to align in a thickness-wise direction of the sheet to form chains, and in a state that the chains by the conductive particles have been distributed in a plane direction.

5. The circuit board device for wafer inspection according to claim 1 or 2, wherein the connector device is obtained by stacking three or more connector units on one another.

6. A probe card comprising the circuit board device for wafer inspection according to claim 1 or 2 and a contact member provided on the circuit board device for wafer inspection.

7. A wafer inspection apparatus comprising the probe card according to claim 6.

8. A connector device comprising a stacked plurality of connector units each having a first anisotropically conductive elastomer sheet, a composite conductive sheet arranged on the first anisotropically conductive elastomer sheet, a second anisotropically conductive elastomer sheet arranged on the composite conductive sheet and a pitch converting board arranged on the second anisotropically conductive elastomer sheet and composed of a wiring board having connecting electrodes on a front surface thereof and terminal electrodes on a back surface thereof, wherein the composite conductive sheet has an insulating sheet, in which a plurality of through-holes each extending in a thickness-wise direction of the insulating sheet have been formed, and rigid conductors respectively arranged into the through-holes in this insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, and wherein each of the connecting electrodes in the pitch converting board is electrically connected to its corresponding terminal electrode in a second pitch converting board arranged above the pitch converting board, through the first anisotropically conductive elastomer sheet, the rigid conductor in the composite conductive sheet and the second anisotropically conductive elastomer sheet.

9. A connector device comprising a stacked of connector units each having a first anisotropically conductive elastomer sheet, a composite conductive sheet arranged on the first anisotropically conductive elastomer sheet, a plate-like spacer member provided on the composite conductive sheet, a second anisotropically conductive elastomer sheet arranged on the spacer member and a pitch converting board arranged on the second anisotropically conductive elastomer sheet and composed of a wiring board having connecting electrodes on a front surface thereof and terminal electrodes on a back surface thereof, wherein the composite conductive sheet has an insulating sheet, in which a plurality of through-holes each extending in a thickness-wise direction of the insulating sheet have been formed, and rigid conductors respectively arranged into the through-holes in the insulating sheet so as to protrude from both surfaces of the insulating sheet, and in each of the rigid conductors, terminal portions having a diameter greater than the diameter of the through-hole are formed on both ends of a body portion inserted into the through-hole in the insulating sheet in order for the conductor to be provided movably in the thickness-wise direction of the insulating sheet, wherein in the spacer member, a plurality of openings having a diameter greater than the diameter of the terminal portion in the rigid conductor is formed at positions corresponding to the respective rigid conductors in the composite conductive sheet, and wherein each of the connecting electrodes in the pitch converting board is electrically connected to its corresponding terminal electrode in a second pitch converting board arranged above the pitch converting board, through the first anisotropically conductive elastomer sheet, the rigid conductor in the composite conductive sheet and the second anisotropically conductive elastomer sheet.

* * * * *